US012640179B2

(12) United States Patent
Liang et al.

(10) Patent No.: US 12,640,179 B2
(45) Date of Patent: May 26, 2026

(54) MEMORY CIRCUIT, INTERFACE CIRCUIT FOR MEMORY CIRCUIT, AND METHOD OF OPERATING MEMORY CIRCUIT

(71) Applicant: TAIWAN SEMICONDUCTOR MANUFACTURING COMPANY, LTD., Hsinchu (TW)

(72) Inventors: Chen-Wei Liang, Hsinchu (TW); Gu-Huan Li, Hsinchu (TW)

(73) Assignee: TAIWAN SEMICONDUCTOR MANUFACTURING COMPANY, LTD., Hsinch (TW)

( * ) Notice: Subject to any disclaimer, the term of this patent is extended or adjusted under 35 U.S.C. 154(b) by 170 days.

(21) Appl. No.: 18/421,138

(22) Filed: Jan. 24, 2024

(65) Prior Publication Data

US 2025/0087259 A1     Mar. 13, 2025

Related U.S. Application Data

(60) Provisional application No. 63/581,878, filed on Sep. 11, 2023.

(51) Int. Cl.
G11C 8/18 (2006.01)

(52) U.S. Cl.
CPC ..................................... G11C 8/18 (2013.01)

(58) Field of Classification Search
CPC .. G11C 8/18; G11C 8/08; G11C 16/32; G11C 17/16; G11C 7/062; G11C 7/067; G11C 7/12; G11C 7/222; G11C 7/1051; G11C 7/1078

USPC ....................................................... 365/233.1
See application file for complete search history.

(56) References Cited

U.S. PATENT DOCUMENTS

2005/0141333 A1*   6/2005   Fujisawa ................ G11C 7/222
365/233.1

FOREIGN PATENT DOCUMENTS

TW              202244922        11/2022

* cited by examiner

*Primary Examiner* — Huan Hoang
*Assistant Examiner* — Minh Dinh
(74) *Attorney, Agent, or Firm* — Hauptman Ham, LLP

(57) ABSTRACT

A memory circuit includes a memory array, and a peripheral circuit. The peripheral circuit includes an internal clock generating circuit, and a first access signal generating circuit. The internal clock generating circuit is configured to, in response to a control signal pulse, generate a series of internal clock pulses at an internal clock period corresponding to a pulse width of the control signal pulse. The first access signal generating circuit is configured to, in response to a first edge of the control signal pulse, generate a first access signal. The peripheral circuit is configured to control an access operation in the memory array, based on at least one internal clock pulse in the series of internal clock pulses, and the first access signal.

20 Claims, 18 Drawing Sheets

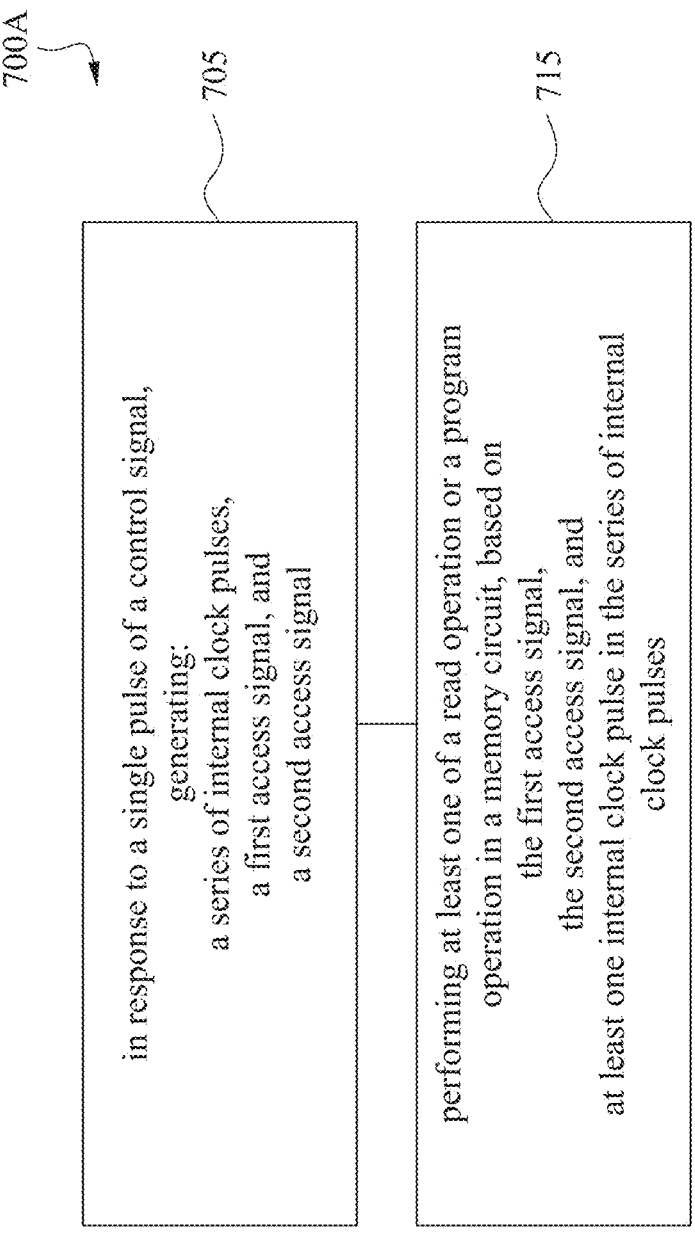

700A

705 in response to a single pulse of a control signal,
generating:
a series of internal clock pulses,
a first access signal, and
a second access signal

715 performing at least one of a read operation or a program
operation in a memory circuit, based on
the first access signal,
the second access signal, and
at least one internal clock pulse in the series of internal
clock pulses

Fig. 7A

MEMORY CIRCUIT, INTERFACE CIRCUIT FOR MEMORY CIRCUIT, AND METHOD OF OPERATING MEMORY CIRCUIT

RELATED APPLICATION(S)

This application claims the benefit of U.S. Provisional Application No. 63/581,878, filed Sep. 11, 2023, which is herein incorporated by reference in its entirety.

BACKGROUND

Integrated circuits (ICs) are widely used in various digital devices and/or applications in different areas. Memories, or memory circuits, are components of IC devices and are configured to store data and/or applications to be processed and/or executed by the IC devices. As ICs as well as their memories have become more complex and/or reduced in size, there are considerations regarding reliability of read operations and/or write (or program) operations performed in the memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4K are schematic circuit diagrams of various circuits, in accordance with some embodiments.

FIGS. 7A-7B are flowcharts of various methods, in accordance with some embodiments.

DETAILED DESCRIPTION

Figure 1:
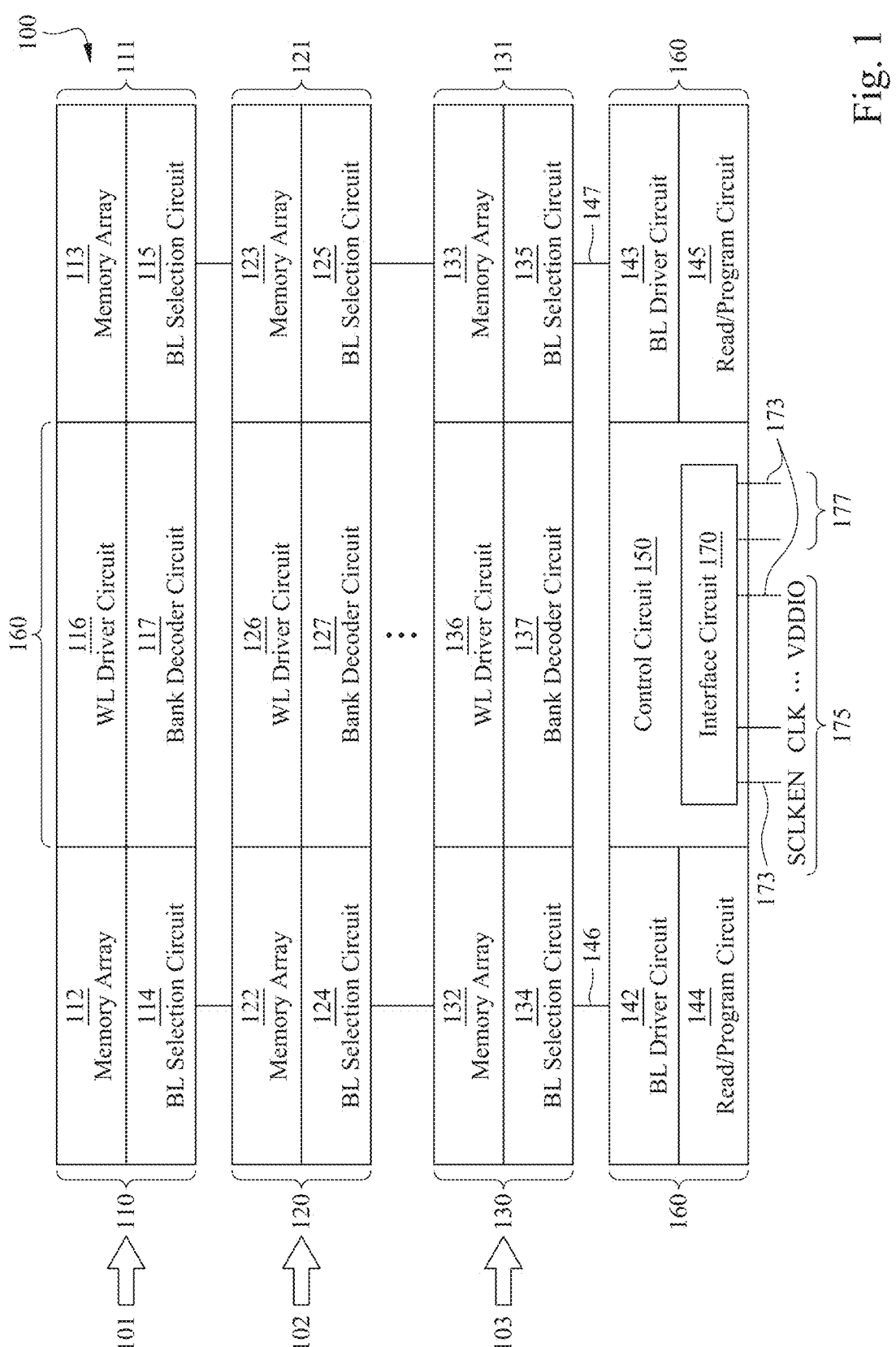
FIG. 1 is a schematic block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An access operation, e.g., a read operation or a program operation, in a memory circuit is a relatively complex process involving several signals that satisfy one or more requirements for a predetermined timing sequence and/or predetermined waveforms in order to ensure that the access operation is correctly and/or reliably performed. In various situation, individually or independently generating several signals to meet the described requirement(s) is a difficult task and/or requires complex circuitry.

In some embodiments, several signals for an access operation in a memory circuit are generated from a common control signal. In at least one embodiment, such several signals are generated from a single pulse of a control signal. Examples of signals generated from a pulse of a control signal (or a control signal pulse) in one or more embodiments include, but are not limited to, a series of internal clock pulses, one or more access signals, or the like. In some embodiments, an access operation in a memory circuit is performed based on the generated internal clock pulses, and the generated one or more access signals. As a result, in one or more embodiments, it is possible to ensure that the various signals generated from a common control signal satisfy one or more requirements for timing sequence and/or waveforms, thereby avoiding, or at least reducing the risk of, malfunction in the memory circuit being accessed.

In at least one embodiment where one or more signals for accessing a memory circuit are external signals provided from circuitry or equipment outside the memory circuit, the number of input/output (I/O) pins (also referred to as I/O pin count) required for receiving such external signals is advantageously reduced, because it is possible to generate several signals for accessing a memory circuit internally, based on an externally provided common control signal. Some embodiments further provide an over-time protection scheme to prevent mis-program or mis-read. In at least one embodiment, a time threshold for such an over-time protection scheme and/or a cell count of memory cells to be accessed is/are advantageously adjustable. In at least one embodiment, improvements in one or more of power-per-formance-area (PPA), reliability, or the like, are achievable.

FIG. 1 is a schematic block diagram of a memory circuit 100, in accordance with some embodiments. In at least one embodiment, the memory circuit 100 is an individual IC device. In some embodiments, the memory circuit 100 is included as a part of a larger IC device which comprises circuitry other than the memory circuit 100 for other functionalities.

The memory circuit 100 comprises memory partitions 101, 102, 103. Each of the memory partitions 101, 102, 103 comprises one or more memory banks, one or more word line (WL) driver circuits, and one or more bank decoder circuits. For example, the memory partition 101 comprises memory banks 110, 111, and a WL driver circuit 116 and a bank decoder circuit 117 between the memory banks 110, 111. The memory partition 102 comprises memory banks 120, 121, and a WL driver circuit 126 and a bank decoder circuit 127 between the memory banks 120, 121. The memory partition 103 comprises memory banks 130, 131, and a WL driver circuit 136 and a bank decoder circuit 137 between the memory banks 130, 131. In some embodiments, a bank decoder circuit is configured as part of a corresponding WL driver circuit. For example, the bank decoder circuit 117 is configured as part of the WL driver circuit 116, or the like. In one or more embodiments, each of the WL driver circuits 116, 126, 136 comprises a program word line (WLP) driver circuit and a read word line (WLR) driver circuit, as described herein.

Each memory bank comprises a memory array and a bit line (BL) selection circuit. For example, each of the memory banks 110, 111, 120, 121, 130, 131 correspondingly comprises one of memory arrays 112, 113, 122, 123, 132, 133, and one of BL selection circuits 114, 115, 124, 125, 134, 135. Each of the memory arrays 112, 113, 122, 123, 132, 133 comprises a plurality of memory cells (not shown in FIG. 1) arranged in a plurality of rows and a plurality of columns, and coupled to the corresponding WL driver circuit and the corresponding BL selection circuit by a plurality of word lines (not shown in FIG. 1) along the rows and a plurality of bit lines along the columns (not shown in FIG. 1), as described herein. In at least one embodiment, the plurality of word lines comprise program word lines and read word lines, as described herein. Example configurations and/or arrangements of memory cells, bit lines, and word lines are described with respect to FIGS. 2A-2B.

In some embodiments, the memory circuit 100 comprises a non-volatile (NVM) memory, and memory cells in the memory circuit 100 are correspondingly NVM memory cells. Examples of non-volatile memories include, but are not limited to, one-time programmable (OTP) memories, such as electronic fuse (eFuse), anti-fuse, flash memory, resistive random-access memory (RAM), ferroelectric RAM, magneto-resistive RAM, phase-change memory (PCM), read only memory (ROM), erasable programmable read only memory (EPROM), electrically erasable programmable read only memory (EEPROM), or the like.

The memory circuit 100 further comprises BL driver circuits 142, 143, read/program circuits 144, 145, global bit lines 146, 147, and a control circuit 150. The BL driver circuit 142 and read/program circuit 144 are selectively couplable, by the global bit line 146, to one of the memory arrays 112, 122, 132 by the corresponding BL selection circuit 114, 124, 134. The BL driver circuit 143 and read/program circuit 145 are selectively couplable, by the global bit line 147, to one of the memory arrays 113, 123, 133 by the corresponding BL selection circuit 115, 125, 135. In FIG. 1, the numbers of memory partitions, global bit lines, BL driver circuits and read/program circuits in the memory circuit 100, the numbers of memory banks and WL driver circuits in each memory partitions, the numbers of memory arrays and BL selection circuits in each memory bank are examples. Other configurations are within the scopes of various embodiments.

Each of the WL driver circuits 116, 126, 136 is configured to receive one or more address signals, and to apply word line voltages on one or more word lines in accordance with the address signals. In some embodiments, where the WL driver circuits 116, 126, 136 comprise WLP driver circuits and WLR driver circuits, the WLP driver circuits are configured to apply program word line voltages on one or more program word lines, and the WLR driver circuits are configured to apply read word line voltages on one or more read word lines, in accordance with the address signals.

Each of the bank decoder circuits 117, 127, 137 is configured to generate enable signals corresponding to memory cells identified by the one or more address signals, and to output the enable signals to the corresponding memory banks of the corresponding memory partition 101, 102, 103. For example, the bank decoder circuit 117 is configured to output the enable signals to the memory banks 110, 111 of the memory partition 101, or the like.

Each of the BL selection circuits 114, 115, 124, 125, 134, 135 is configured to selectively access one or more bit lines in the corresponding memory array 112, 113, 122, 123, 132, 133, by selectively coupling the one or more bit lines to the corresponding BL driver circuit 142,143 and/or the corresponding read/program circuit 144, 145 through the corresponding global bit line 146, 147.

Each of the BL driver circuits 142, 143 is configured to generate and apply a bit line voltage on the corresponding global bit line 146, 147 in accordance with an access operation of one or more memory cells in the memory circuit 100. The bit line voltage is applied to the one or more memory cells to be accessed through the corresponding BL selection circuit and bit lines.

Each of the read/program circuits 144, 145 is configured to perform read and/or program operations of one or more memory cells in the memory circuit 100. In some embodiments, each of read/program circuits 144, 145 comprises a read circuit configured to perform read operations and a program circuit configured to perform program operations of one or more memory cells in the memory circuit 100. In some embodiments, a read circuit comprises a sense amplifier configured to determine an absolute and/or relative voltage and/or current level of one or more signals received from a selected memory cell through the corresponding global bit line 146, 147.

The control circuit 150 is configured to control some or all of program and read operations on memory cells in the memory circuit 100, e.g., by generating and/or outputting one or more control and/or enable signals. In some embodiments, the control circuit 150 comprises one or more circuits including, but not limited to, global address decoder circuits, pre-decoder circuits, pre-charging circuits, address latches, pulse generators, timing circuits, clock generators and/or drivers, input/output (I/O) circuits for data, address, clock and/or control exchange with external devices, or the like. Examples of I/O signals transmitted and/or received by the I/O circuits comprise clock signals, addresses of memory cells to be accessed, input data to be written or programmed to accessed memory cells, output data read from accessed memory cells, a chip enable (CEB) signal, a write enable (WEB) signal, or the like. The CEB signal is a signal to enable or disable the memory circuit 100 or one or more of the memory partitions 101, 102, 103 thereof. The signal WEB is a signal to enable or disable writing to one or more memory cells. Other I/O signals are within the scopes of various embodiments. The described memory circuit configuration is an example, and other memory circuit configurations are within the scopes of various embodiments.

In some embodiments, circuits in a memory circuit, which are other than memory arrays, are collectively referred to as a peripheral circuit. In the example configuration in FIG. 1, the WL driver circuits 116, 126, 136, bank decoder circuits 117, 127, 137, BL driver circuits 142,143, read/program circuits 144, 145, and control circuit 150 are collectively referred to as a peripheral circuit 160. In some embodiments, the peripheral circuit 160 further comprises the BL selection circuits 114, 115, 124, 125, 134, 135. A peripheral circuit is sometimes referred to as a memory controller.

The peripheral circuit 160 comprises an interface circuit 170 which has a plurality of I/O pins 173. Some I/O pins 173 are configured to receive input signals 175 for controlling an access operation of one or more memory cells in the memory circuit 100. One or more other I/O pins 173 are configured to transmit output signals 177. In some embodiments, at least one, or some, or all of the input signals 175 and/or output signals 177 are I/O signals as described herein. In the example configuration in FIG. 1, the input signals 175 comprise a clock signal CLK, a power supply voltage VDDIO, and a control signal SCLKEN. In at least one embodiment, the interface circuit 170 is configured to, based on a pulse of the control signal SCLKEN, generate a series of internal clock pulses and one or more access signals for controlling an access operation of one or more memory cells in the memory circuit 100. In at least one embodiment, the output signals 177 comprise data read from one or more memory cells of the memory circuit 100. In some embodiments, the output signals 177 are omitted or are output by an I/O circuit other than the interface circuit 170. The arrangement of the interface circuit 170 in the control circuit 150 in FIG. 1 is an example. In at least one embodiment, the interface circuit 170 is included in the peripheral circuit 160, but outside the control circuit 150.

In some embodiments, at least one, or some, or all of the input signals 175 are generated by and/or provided from an IC device comprising, or permanently coupled to, the memory circuit 100. An example of an IC device permanently coupled to a memory circuit is an IC structure or package in which the memory circuit is configured as a memory chip or die arranged on, or adjacent to, the IC device. I/O pins, e.g., the I/O pins 173, of the memory die are coupled to corresponding I/O pins of the IC device by conductive traces and/or vias on, or through, a substrate which is arranged between, or supports thereon, the memory die and IC device.

In some embodiments, at least one, or some, or all of the input signals 175 are generated by and/or provided from external circuitry or external equipment which is detachably or removably coupled to the memory circuit 100. For example, after the manufacture of the memory circuit 100 and before shipping the memory circuit 100 to a customer or proceeding with further manufacturing processes, the memory circuit 100 is subject to a test sometimes referred to as wafer acceptance testing (WAT). For such a test, terminals of external testing equipment are brought into contact with corresponding terminals of the memory circuit 100. The testing equipment sends test signals, data or patterns, and receives test results, through the corresponding terminals of the testing equipment and the memory circuit 100, to verify whether the memory circuit 100 is manufactured and/or functions as designed. Upon completion of the test, the terminals of external testing equipment are detached or disconnected from the terminals of the memory circuit 100.

In at least one embodiment, the configuration of the interface circuit 170 to internally generate various signals based on the control signal SCLKEN ensures reliability of the access operation and/or reduces the number of I/O pins 173 required for receiving the input signals 175 for controlling the access operation. In some embodiments, such effects are further noticeable in a test situation where the number of pins or terminals of the testing equipment is limited, and/or when the timing and/or waveform of test signals provided by the testing equipment are less than ideal and/or subject to undesirable variations.

Figures 2A, 2B:
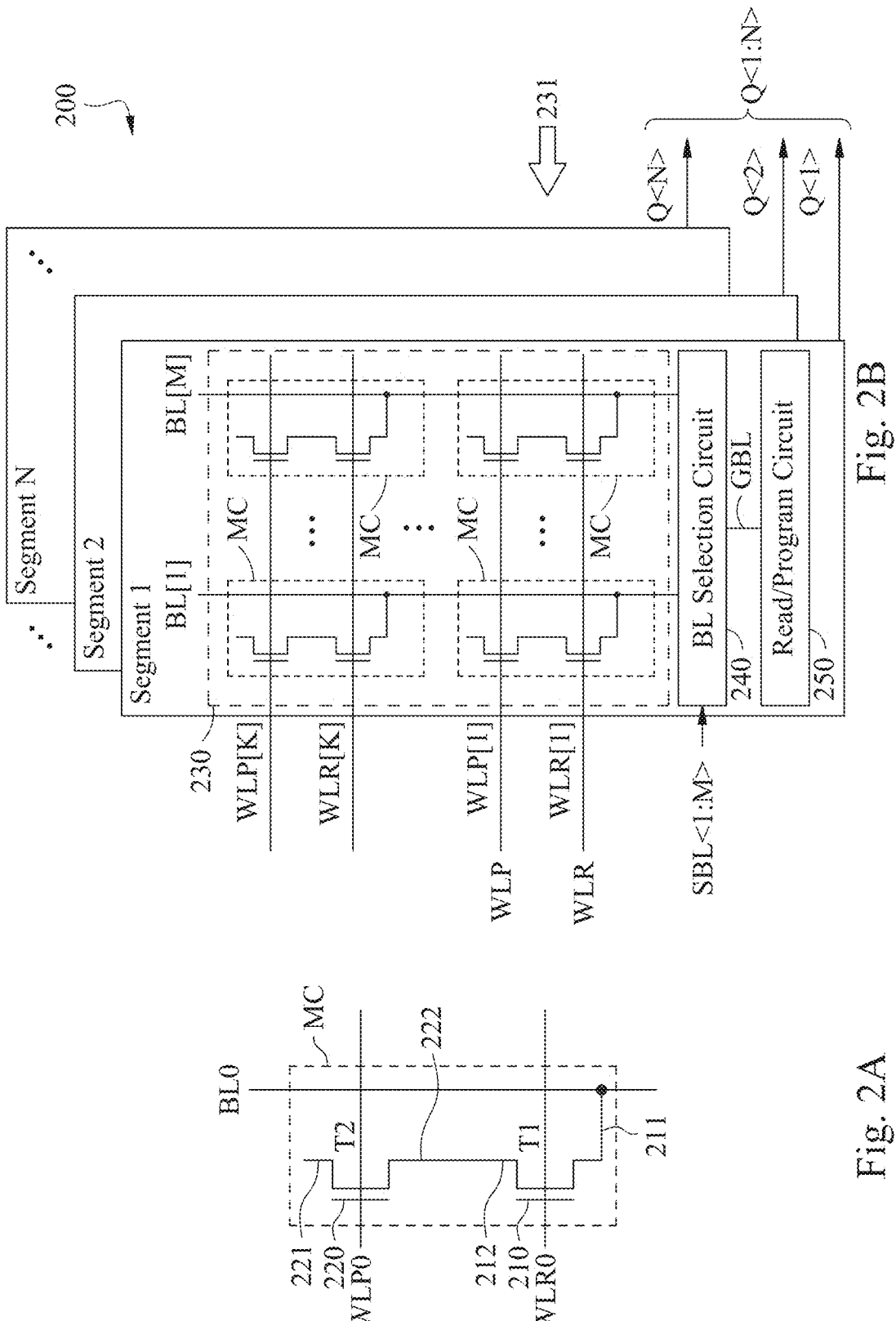
FIG. 2A is a schematic circuit diagram of a memory cell, in accordance with some embodiments.
FIG. 2B is a schematic block diagram of a memory circuit, in accordance with some embodiments.

FIG. 2A is a schematic circuit diagram of a memory cell MC, in accordance with some embodiments. In at least one embodiment, the memory cell MC corresponds to a memory cell in the memory circuit 100. In the example configuration in FIG. 2A, the memory cell MC is an anti-fuse. Other memory configurations are within the scopes of various embodiments.

The memory cell MC is coupled to a read word line WLR0, a program word line WLP0, and a bit line BL0. The memory cell MC comprises transistors T1, T2. The transistor T1 (sometimes referred to as an access transistor) comprises a gate terminal 210 coupled to the read word line WLR0, a first terminal 211 coupled to the bit line BL0, and a second terminal 212. The transistor T2 (sometimes referred to as an anti-fuse transistor) comprises a gate terminal 220 coupled to the program word line WLP0, a first terminal 221 which is floating, and a second terminal 222 coupled to the second terminal 212 of the transistor T1. In other words, the transistors T1, T2 are serially coupled with each other.

The read word line WLR0 is an example of one of a first word line and a second word line coupled to the memory cell MC, and the program word line WLP0 is an example of the other of the first word line and the second word line. The numbers of word lines and/or bit line coupled to a memory cell as described with respect to FIG. 2A are examples. Other configurations are within the scopes of various embodiments. For example, in various memory configurations, each memory cell is coupled to one word line and one bit line, or each memory cell is coupled to one word line and a pair of bit lines, or each memory cell is coupled to a pair of word lines and a pair of bit lines, or the like.

Examples of the transistor T1 and/or the transistor T2 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The first terminal 211 is a source/drain of the transistor T1, and the second terminal 212 is another source/drain of the transistor T1. The first terminal 221 is a source/drain of the transistor T2, and the second terminal 222 is another source/drain of the transistor T2. In the example configuration described with respect to FIG. 2A, the transistor T1 and the transistor T2 are NMOS transistors, the first terminal 211 is a source of the transistor T1, the second terminal 212 is a drain of the transistor T1, the first terminal 221 is a drain of the transistor T2, and the second terminal 222 is a source of the transistor T2. Other configurations including PMOS transistors instead of NMOS transistors are within the scopes of various embodiments. In some embodiments, the second terminal 212 of the transistor T1 and the second terminal 222 of the transistor T2 are the same, i.e., the transistor T1 and the transistor T2 share a common source/drain. In at least one embodiment, the transistor T1 and the transistor T2 are identically configured. For example, the transistor T1 and the transistor T2 have the same size, and are manufactured by the same processes.

The transistor T2 comprises a gate dielectric which is configured to be broken down when a predetermined breakdown voltage that is sufficient to break down the gate dielectric is applied across the gate dielectric. When the gate dielectric of the transistor T2 is broken down, the broken-down gate dielectric is configured as a resistor and corresponds to a first datum, e.g., logic "0," stored in the memory cell MC. When the gate dielectric is not broken down, the memory cell MC stores a different, second datum, e.g., logic "1." Example materials of the gate dielectric include, but are not limited to, silicon dioxide, a high-k dielectric, or the like. Examples of high-k dielectrics include, but are not limited to, zirconium dioxide, hafnium dioxide, zirconium silicate, hafnium silicate, or the like.

In some embodiments, access operations, such as read operations and program operations, of the memory cell MC are controlled by a controller (not shown). In at least one embodiment, the controller corresponds to the peripheral circuit 160. The controller is coupled to the memory cell MC via the read word line WLR0, the program word line WLP0, and the bit line BL0. Example access operations in accordance with some embodiments are described herein.

In a program operation for programming the memory cell MC to store logic "0," the controller applies a ground voltage (e.g., 0 V) to the bit line BL0, a first access voltage (e.g., 1.2 V) to the read word line WLR0, and a program voltage (e.g., 5 V) to the program word line WLP0. Since the first access voltage is applied to the gate terminal 210 of the transistor T1 through the read word line WLR0, the transistor T1 is turned on. The ground voltage on the bit line BL0 is applied to the terminal 222 of the transistor T2 through the turned ON transistor T1. The program voltage applied to the gate terminal 220 of the transistor T2 and the ground voltage on the terminal 222 of the transistor T2 cause a voltage stress equal to the program voltage across the gate dielectric of the transistor T2. Since the program voltage is higher than the predetermined breakdown voltage of the gate dielectric, the gate dielectric of the transistor T2 is broken down, corresponding to logic "0" being stored in the memory cell MC.

In a program operation for programming the memory cell MC to store logic "1," the controller applies the first access voltage (e.g., 1.2 V) to both the bit line BL0 and the read word line WLR0, and the program voltage (e.g., 5 V) to the program word line WLP0. The transistor T1 is turned ON, and the first access voltage is applied to the terminal 222 of the transistor T2 through the turned ON transistor T1. A voltage stress across the gate dielectric of the transistor T2 is a voltage difference between the program voltage and the first access voltage (e.g., 5 V minus 1.2 V). This voltage stress is not higher than the predetermined breakdown voltage of the gate dielectric, and the gate dielectric of the transistor T2 is not broken down, corresponding to logic "1" being stored in the memory cell MC.

In a read operation of the memory cell MC, the controller applies the ground voltage, a second access voltage (e.g., 0.75 V) to the read word line WLR0, and a read voltage (e.g., 1.45 V) to the program word line WLP0. The transistor T1 is turned ON, the read voltage is not sufficient to change the programed state (or datum) of the transistor T2, and a read current is caused to flow through the bit line BL0, to the controller. The read current is higher when the gate dielectric of the transistor T2 has been broken down, and is lower when the gate dielectric of the transistor T2 has not been broken down. A sense amplifier in the controller detects the read current and output the datum stored in and read out from the memory cell MC. The specific voltage values described herein, e.g., 1.2 V, 5 V, 0.75 V, 1.45 V, are examples. Other voltage values are within the scopes of various embodiments.

FIG. 2B is a schematic block diagram of a memory circuit 200, in accordance with some embodiments. In some embodiments, the memory circuit 200 corresponds to the memory circuit 100.

The memory circuit 200 comprises N segments indicated as Segment 1, Segment 2, to Segment N, where N is a natural number. In some embodiments, Segment 1, Segment 2, to Segment N are similarly configured. Segment 1 is described herein, and detailed descriptions of Segment 2 to Segment N are omitted. Segment 1 comprises one or more memory arrays and corresponding one or more BL selection circuits. For example, a memory array 230 and a corresponding BL selection circuit 240 are illustrated in FIG. 2B. In some embodiments, the memory array 230 corresponds to one or more of the memory arrays 112, 113, 122, 123, 132, 133, and the BL selection circuit 240 corresponds to one or more of the BL selection circuits 114, 115, 124, 125, 134, 135.

In the example configuration in FIG. 2B, the memory array 230 comprises a plurality of memory cells MC described with respect to FIG. 2A. The memory cells MC are arranged in a plurality of rows (not numbered) and a plurality of columns (not numbered). The memory cells MC in each of the rows are coupled to a corresponding pair of word lines, and the memory cells MC in each of the columns are coupled to a corresponding bit line. For example, the memory array 230 comprises K pairs of word lines and M columns, where K and M are natural numbers. A pair of word lines WLR[1], WLP[1] is coupled to the memory cells MC in a first row 231, another pair of word lines (not shown) is coupled to the memory cells MC in a second row (not shown), and a pair of word lines WLR[K], WLP[K] is coupled to the memory cells MC in a $K^{th}$ row. A bit line BL[1] is coupled to the memory cells MC in a first column, another bit line (not shown) is coupled to the memory cells MC in a second column, and a bit line BL[M] is coupled to the memory cells MC in an $M^{th}$ column. In some embodiments, each of the bit lines BL[1] to BL[M] corresponds to the bit line BL0, each of the word lines WLP[1] to WLP[K] corresponds to the program word line WLP0, and each of the word lines WLR[1] to WLR[K] corresponds to the read word line WLR0.

Segment 1 further comprises a global bit line GBL, and a read/program circuit 250 coupled to the BL selection circuit 240 by the global bit line GBL. In some embodiments, the global bit line GBL corresponds to one or more of the global bit lines 146, 147, and the read/program circuit 250 corresponds to one or more of the read/program circuits 144, 145. In some embodiments, Segment 1 further comprises a BL driver circuit corresponding to one or more of the BL driver circuits 142,143. The read/program circuit 250 is configured to output read data Q<1> read from one or more memory cells MC of the memory array 230. Corresponding read/program circuits of Segment 2 to Segment N are configured to output read data Q<2> to read data Q<N> read from one or more memory cells of corresponding memory arrays in Segment 2 to Segment N. The read data Q<1>, Q<2> to Q<N> are collectively referred to as read data Q<1:N>.

As described with respect to FIG. 2A, in an access operation of the memory array 230, various voltages are applied, e.g., by a controller as described herein, to the word lines of the memory array 230. For example, in an access operation of one or more memory cells MC in the row 231, the word line WLR[1] and the word line WLP[1] are accessed, by applying a first or second access voltage to the word line WLR[1], and applying a program voltage or a read voltage to the word line WLP[1]. In some embodiments, the voltage levels (or voltage values) of the first access voltage, the second access voltage, the program voltage, and the read voltage are controlled by corresponding WL driver circuits coupled to the word lines WLR[1], WLP[1], whereas the timing and duration (or the rising edge and falling edge) of the voltages are controlled by access signals WLR, WLP. In some embodiments, the timing and duration (or the rising edge and falling edge) of the first access voltage or the second access voltage on the word line WLR[1] correspond to the timing and duration (or the rising edge and falling edge) of the access signal WLR. For example, the access signal WLR is applied to a gate or an input or a control terminal of a WLR driver circuit (e.g., a transistor or an inverter) and causes the WLR driver circuit to output the corresponding first access voltage or second access voltage to the word line WLR[1]. In some embodiments, the timing and duration (or the rising edge and falling edge) of the program voltage or the read voltage on the word line WLP[1] correspond to the timing and duration (or the rising edge and falling edge) of the access signal WLP. For example, the access signal WLP is applied to a gate or an input or a control terminal of a WLP driver circuit (e.g., a transistor or an inverter) and causes the WLP driver circuit to output the corresponding program voltage or read voltage to the word line WLP[1]. The access signal WLR is an example of a first access signal and a second access signal, and the access signal WLP is an example of the other of the first access signal and the second access signal.

Further, during the access operation of the memory array 230, the BL selection circuit 240 is configured to sequentially access the bit lines BL[1] to BL[M], by coupling each of the bit lines BL[1] to BL[M], one bit line at a time, to the global bit line GBL, in response to a corresponding one of BL selection signals SBL<1> to SBL<M> which are collectively referred to as BL selection signals SBL <1:M>. As a result, the read/program circuit 250 is sequentially coupled to, or sequentially accesses, the bit lines BL[1] to BL[M], one bit line at a time, to perform a read operation or program operation of the memory cell MC coupled to the word lines WLR[1], WLP[1] and the bit line being accessed. The memory cells MC in the other rows of the memory array 230 are accessed in similar manner.

In some embodiments, the BL selection signals SBL <1:M> correspond to a series of internal clock pulses. An example circuit configured to generate the BL selection signals SBL <1:M> based on an internal clock signal SCLK having the series of internal clock pulses is described with respect to FIG. 4A. In some embodiments, the internal clock signal SCLK and at least one of the access signals WLR, WLP are generated by an interface circuit, e.g., one or more interface circuits described herein, based on a pulse of a control signal, e.g., the control signal SCLKEN.

Figure 3A:
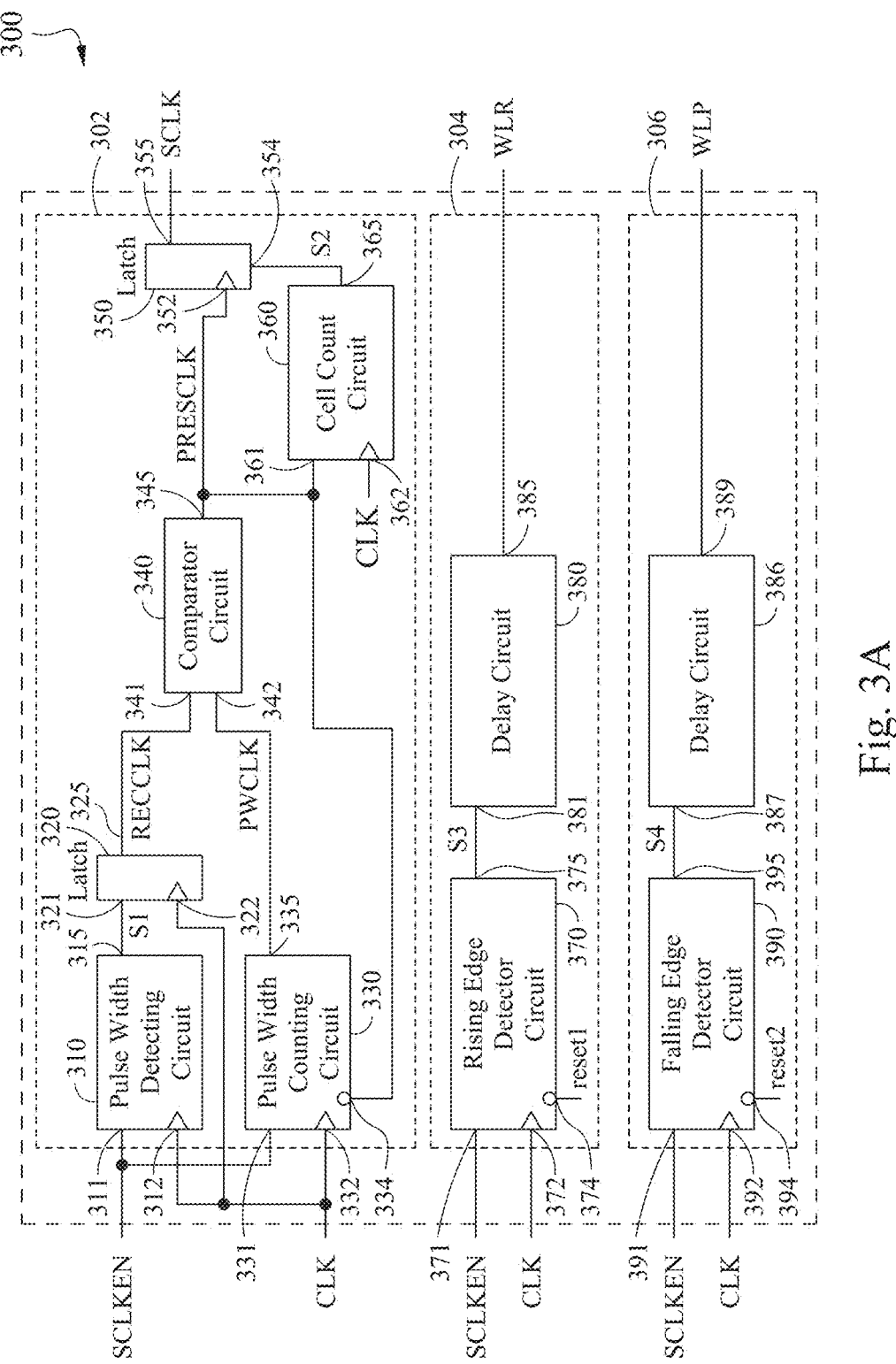
FIG. 3A is a schematic block diagram of an interface circuit of a memory circuit.
Figure 3B:
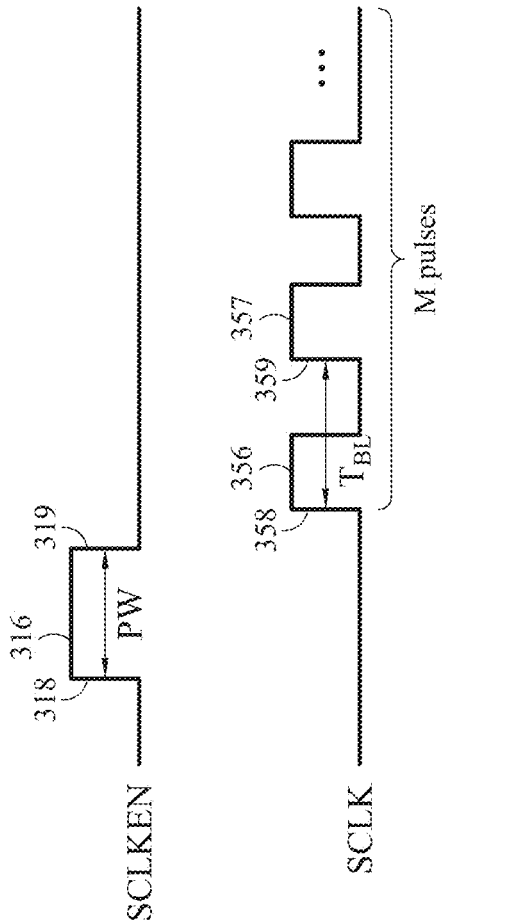
FIG. 3B is a schematic timing diagram of various signals in the interface circuit, in accordance with some embodiments.

FIG. 3A is a schematic block diagram of an interface circuit 300 of a memory circuit, in accordance with some embodiments. FIG. 3B is a schematic timing diagram of a control signal SCLKEN input into the interface circuit 300, and an internal clock signal SCLK output from the interface circuit 300, in accordance with some embodiments. In at least one embodiment, the interface circuit 300 corresponds to the interface circuit 170, and/or is part of a peripheral circuit of a memory circuit such as the peripheral circuit 160 of the memory circuit 100, or a peripheral circuit of the memory circuit 200.

The interface circuit 300 comprises an internal clock generating circuit 302, and access signal generating circuits 304, 306. One of the access signal generating circuits 304, 306 is an example of a first access signal generating circuit, whereas the other of the access signal generating circuits 304, 306 is an example of a second access signal generating circuit. In some embodiments, one of the access signal generating circuits 304, 306 is omitted.

The internal clock generating circuit 302 comprises a pulse width detecting circuit 310, a storage circuit 320, a pulse width counting circuit 330, a comparator circuit 340, a further output circuit 350, and a cell count circuit 360.

The pulse width detecting circuit 310 comprises an input 311 coupled to a control signal input to receive a control signal SCLKEN, a clock input 312 coupled to a clock signal input to receive a clock signal CLK, and an output 315. For simplicity, an input, node or output is sometimes referred to herein by the same reference numeral of the signal at the input, node or output. For example, the control signal input to receive the control signal SCLKEN is sometimes referred to herein the control signal input SCLKEN, the clock signal input to receive the clock signal CLK is sometimes referred to herein the clock signal input CLK, or the like. The control signal input SCLKEN and clock signal input CLK correspond to inputs of the internal clock generating circuit 302. An example configuration of the pulse width detecting circuit 310 is described with respect to FIG. 4B.

The storage circuit 320 comprises an input 321 coupled to the output 315 of the pulse width detecting circuit 310, a clock input 322 coupled to the clock signal input CLK, and an output 325. In the example configuration in FIG. 3A, the storage circuit 320 comprises a latch circuit (sometimes referred to as a latch). Other storage circuit configurations configured to store data are within the scopes of various embodiments.

The pulse width counting circuit 330 comprises an input 331 coupled to the control signal input SCLKEN, a clock input 332 coupled to the clock signal input CLK, a reset input 334, and an output 335. An example configuration of the pulse width counting circuit 330 is described with respect to FIG. 4C.

The comparator circuit 340 comprises a first input 341 coupled to the output 325 of the storage circuit 320, a second input 342 coupled to the output 335 of the pulse width counting circuit 330, and an output 345 coupled to the reset input 334 of the pulse width counting circuit 330. In an example configuration, the comparator circuit 340 comprises an operational amplifier and/or a logic gate. Other comparator circuit configurations are within the scopes of various embodiments.

The output circuit 350 comprises a clock input 352 coupled to the output 345 of the comparator circuit 340, an enable input 354, and an output 355 which corresponds to an output of the internal clock generating circuit 302. In the example configuration in FIG. 3A, the output circuit 350 comprises a latch circuit. Other output circuit configurations are within the scopes of various embodiments.

The cell count circuit 360 comprises an input 361 coupled to the output 345 of the comparator circuit 340, a clock input 362 coupled to the clock signal input CLK, and an output 365 coupled to the enable input 354 of the output circuit 350.

Figure 4A:
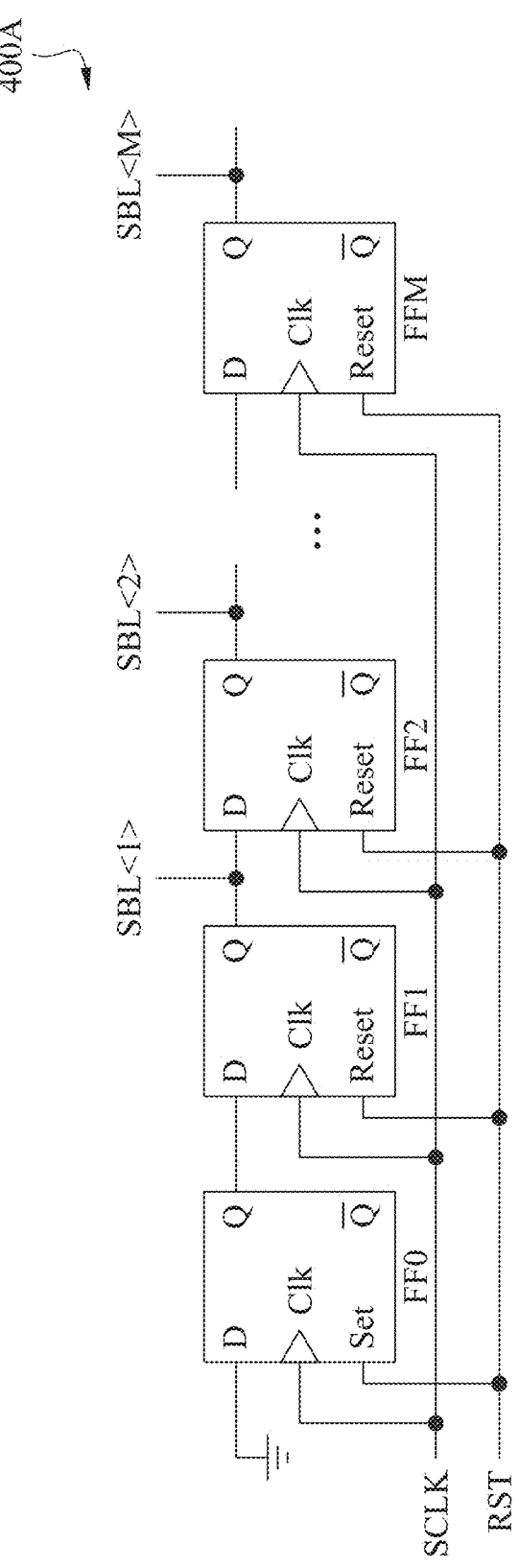
Figures 4B, 4C:
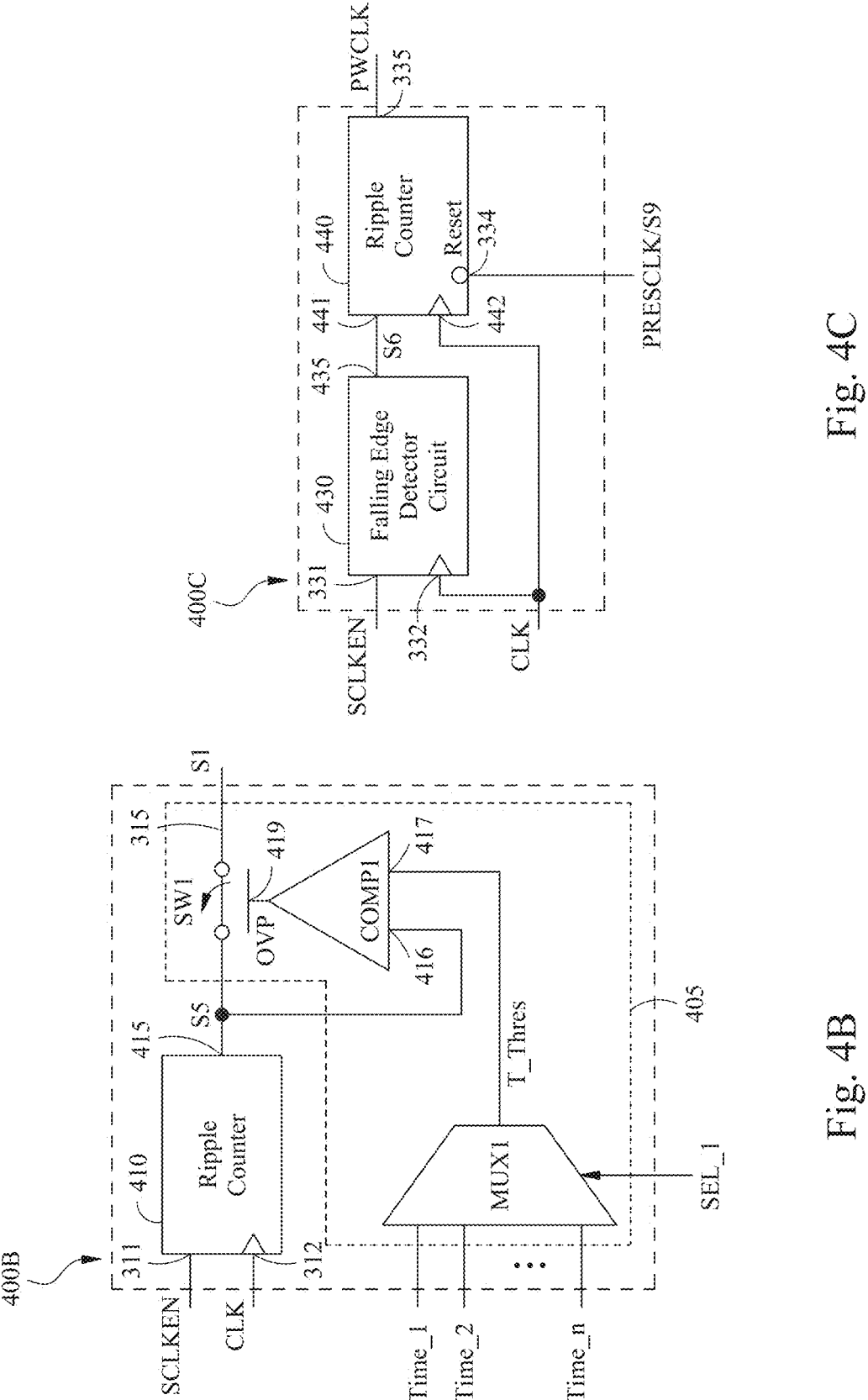
Figure 4D:
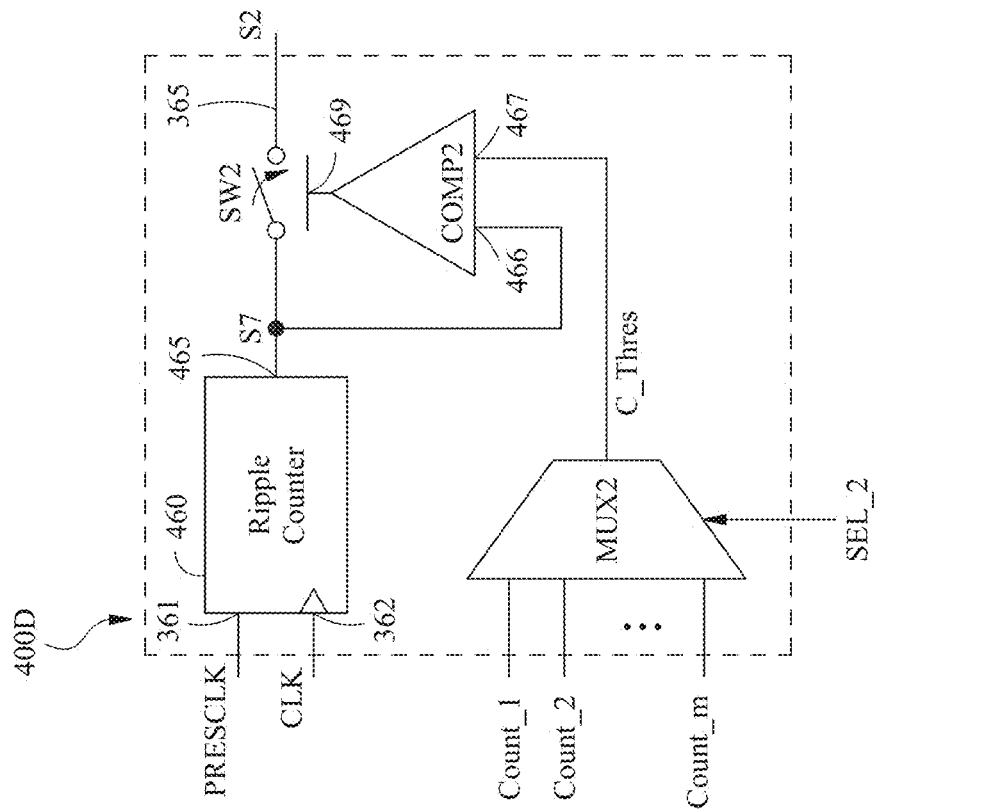

An example configuration of the cell count circuit 360 is described with respect to FIG. 4D.

The pulse width detecting circuit 310 is configured to detect a pulse width of a control signal pulse of the control signal SCLKEN received at the input 311, and output the detected pulse width via a signal S1 at the output 315. For example, as illustrated in FIG. 3B, the control signal SCLKEN comprises a control signal pulse 316 having a rising edge 318, a falling edge 319, and a pulse width PW between the rising edge 318 and falling edge 319. In at least one embodiment, in response to the rising edge 318, the pulse width detecting circuit 310 is configured to start counting a number of clock pulses of the clock signal CLK (herein referred to as clock pulses CLK), and, in response to the falling edge 319, the pulse width detecting circuit 310 is configured to stop counting. The number of clock pulses CLK counted by the pulse width detecting circuit 310 between the rising edge 318 and falling edge 319 corresponds to the detected pulse width PW of the control signal pulse 316. The counted number of clock pulses CLK, or the detected pulse width PW, is output via the signal S1 at the output 315 of the pulse width detecting circuit 310.

The storage circuit 320 is configured to store the detected pulse width PW of the control signal pulse 316 received via the signal S1 at the input 321, and output the detected pulse width PW via a signal RECCLK at the output 325. In at least one embodiment, the storage circuit 320 is configured to store, and output, the counted number of clock pulses CLK output by the pulse width detecting circuit 310 as the detected pulse width PW of the control signal pulse 316.

The pulse width counting circuit 330 is configured to count a number of clock pulses CLK in response to an edge of the control signal pulse 316. In some embodiments, the pulse width counting circuit 330 is configured to count a number of clock pulses CLK in response to the falling edge 319 of the control signal pulse 316. In at least one embodiment, the pulse width counting circuit 330 is configured to count a number of clock pulses CLK after the falling edge 319, i.e., after the control signal pulse 316 has ended. The number of clock pulses CLK counted by the pulse width counting circuit 330 is output via a signal PWCLK at the output 335 of the pulse width counting circuit 330.

The comparator circuit 340 is configured to compare the number of clock pulses CLK counted by the pulse width counting circuit 330 received as the signal PWCLK at the second input 342 with the detected pulse width PW of the control signal pulse 316 received as the signal RECCLK at the first input 341. In response to the number of clock pulses CLK represented by the signal PWCLK being equal to the detected pulse width PW represented by the signal REC-CLK, the comparator circuit 340 is configured to output a pulse of a signal PRESCLK at the output 345. The pulse of the signal PRESCLK (sometimes referred to herein as PRESCLK pulse) is applied to the reset input 334 to reset the counted number of the pulse width counting circuit 330, e.g., to zero. The pulse width counting circuit 330 is configured to again count the number of clock pulses CLK from zero up to the detected pulse width PW represented by the signal RECCLK, at which time the comparator circuit 340 is configured to output a next PRESCLK pulse. The next PRESCLK pulse again resets the pulse width counting circuit 330, and the described process is repeated. As a result, PRESCLK pulses are generated at a period corresponding to the detected pulse width PW stored in the storage circuit 320.

The output circuit 350 is configured to, in response to each pulse in the signal PRESCLK arriving at the clock input 352, output a corresponding pulse of an internal clock signal SCLK at the at least one conductor 355. For example, as illustrated in FIG. 3B, the internal clock signal SCLK comprises a series of internal clock pulses 356, 357, or the like. The internal clock pulses of the internal clock signal SCLK are sometimes referred to as internal clock pulses SCLK. The internal clock pulses SCLK are generated at an internal clock period $T_{BL}$ between successive internal clock pulses SCLK, e.g., between a rising edge 358 of the internal clock pulse 356 and a rising edge 359 of the internal clock pulse 357. Because each internal clock pulse SCLK corresponds to one PRESCLK pulse, the internal clock period $T_{BL}$ corresponds to the period of the PRESCLK pulses and corresponds to the detected pulse width PW stored in the storage circuit 320. In other words, the internal clock generating circuit 302 is configured to, in response to the control signal pulse 316, generate a series of internal clock pulses SCLK at the internal clock period $T_{BL}$ corresponding to the pulse width PW of the control signal pulse 316.

The cell count circuit 360 is configured to count a number of pulses in the signal PRESCLK arriving at the input 361, which corresponds to the number of internal clock pulses SCLK output at the output 355. In response to the counted number of internal clock pulses SCLK being equal to a predetermined value (or a predetermined cell count) set in, or input into, the cell count circuit 360, the cell count circuit 360 is configured to output a signal S2 at the output 365. The signal S2 is applied to the enable input 354 of the output circuit 350 to stop the output circuit 350 from outputting further internal clock pulses SCLK regardless of further PRESCLK pulses arriving at the clock input 352. As a result, the number of internal clock pulses SCLK output by the internal clock generating circuit 302 is controlled by the predetermined cell count of the cell count circuit 360. In some embodiments, the predetermined cell count in the cell count circuit 360 is M which is the number of bit lines in a memory array to be accessed in an access operation, as described with respect to FIG. 2B. For example, as illustrated in FIG. 3B, the internal clock signal SCLK includes M pulses. In some embodiments, the predetermined cell count in the cell count circuit 360 is greater than M, resulting in some of the internal clock pulses SCLK being unused for the access operation. The interface circuit 300, or another circuit of the peripheral circuit of the memory circuit, is configured to, based on the internal clock pulses SCLK output by the internal clock generating circuit 302, generate BL selection signals, as described with respect to FIG. 2B.

As described herein, the configuration of the output circuit 350 being a latch circuit is an example. Any output circuit 350 configured to be disabled, or to stop outputting further internal clock pulses SCLK, in response to the signal S2 is within the scopes of various embodiments. The signal S1, signal RECCLK, signal PWCLK, signal PRESCLK, signal S2, as well as signals S3-S9 described herein below, are example of intermediate signals in the internal clock generating circuit 302. The described configuration of the internal clock generating circuit 302 is an example. Other configurations are within the scopes of various embodiments.

The access signal generating circuit 304 comprises a rising edge detector circuit 370 and a delay circuit 380. The rising edge detector circuit 370 comprises an input 371 coupled to the control signal input SCLKEN, a clock input 372 coupled to the clock signal input CLK, a reset input 374 configured to receive a reset signal reset1, and an output 375. The delay circuit 380 comprises an input 381 coupled to the output 375 of the rising edge detector circuit 370, and an output 385. The control signal input SCLKEN and the clock signal input CLK correspond to inputs of the access signal generating circuit 304, and the output 385 of the delay circuit 380 corresponds to an output of the access signal generating circuit 304. In some embodiments, the delay circuit 380 is omitted, and the output 375 of the rising edge detector circuit 370 corresponds to the output of the access signal generating circuit 304. An example configuration of the rising edge detector circuit 370 is described with respect to FIG. 4E. An example configuration of the delay circuit 380 comprises one or more inverters. Other configurations of the rising edge detector circuit 370 and/or the delay circuit 380 are within the scopes of various embodiments.

The rising edge detector circuit 370 is configured to detect the rising edge 318 of the control signal pulse 316, and, in response to the detected rising edge 318, generate a rising edge of a signal S3 at the output 375. The rising edge detector circuit 370 is configured to keep the output 375 at a high level, e.g., logic "1," until the reset signal reset1 is applied to the reset input 374. In response to the reset signal reset1 applied at the reset input 374, the rising edge detector circuit 370 is configured to generate a falling edge of the signal S3. An example circuit configured to generate the reset signal reset1 is described with respect to FIG. 4G.

The delay circuit 380 is configured to output a delayed version of the signal S3 as the access signal WLR. In some embodiments, the delay circuit 380 is omitted, and the signal S3 is output as the access signal WLR. A duration of the access signal WLR is determined by the rising edge 318 of the control signal pulse 316 and the reset signal reset1, and is configured to be sufficient for an access operation in the memory circuit.

The access signal generating circuit 306 comprises a falling edge detector circuit 390 and a delay circuit 386. The falling edge detector circuit 390 comprises an input 391 coupled to the control signal input SCLKEN, a clock input 392 coupled to the clock signal input CLK, a reset input 394 configured to receive a reset signal reset2, and an output 395. The delay circuit 386 comprises an input 387 coupled to the output 395 of the falling edge detector circuit 390, and an output 389. The control signal input SCLKEN and the clock signal input CLK correspond to inputs of the access signal generating circuit 306, and the output 389 of the delay circuit 386 corresponds to an output of the access signal generating circuit 306. In some embodiments, the delay circuit 386 is omitted, and the output 395 of the falling edge detector circuit 390 corresponds to the output of the access signal generating circuit 306. An example configuration of the falling edge detector circuit 390 is described with respect to FIG. 4F. An example configuration of the delay circuit 386 comprises one or more inverters. Other configurations of the falling edge detector circuit 390 and/or the delay circuit 386 are within the scopes of various embodiments.

The falling edge detector circuit 390 is configured to detect the falling edge 319 of the control signal pulse 316, and, in response to the detected falling edge 319, generate a rising edge of a signal S4 at the output 395. The falling edge detector circuit 390 is configured to keep the output 395 at a high level, e.g., logic "1," until the reset signal reset2 is applied to the reset input 394. In response to the reset signal reset2 applied at the reset input 394, the falling edge detector circuit 390 is configured to generate a falling edge of the signal S4. In at least one embodiment, the reset signal reset2 is received at the reset input 394 before the reset signal reset1 is received at the reset input 374. An example circuit configured to generate the reset signal reset2 is described with respect to FIG. 4H.

The delay circuit 386 is configured to output a delayed version of the signal S4 as the access signal WLP. In some embodiments, the delay circuit 386 is omitted, and the signal S4 is output as the access signal WLP. A duration of the access signal WLP is determined by the falling edge 319 of the control signal pulse 316 and the reset signal reset2, and is configured to be sufficient for an access operation in the memory circuit. In some embodiments, the duration of the access signal WLP is within the duration of the access signal WLR. The described configuration of the access signal generating circuits 304, 306 are examples. Other configurations are within the scopes of various embodiments.

In some embodiments, the peripheral circuit of the memory circuit is configured to control an access operation in the memory array, based on at least one of the internal clock pulses SCLK and at least one of the access signals WLR, WLP. For example, as described with respect to FIG. 2B and/or FIG. 4A, the internal clock pulses SCLK are used for generation of BL selection signals for selecting bit lines coupled to memory cells to be accessed, whereas the access signals WLR, WLP are used to control various voltages applied to the corresponding word lines coupled to the memory cells to be accessed.

Compared to other approaches where various signals similarly to signals SCLK, WLR, WLP are input individually into a memory circuit for an access operation, it is sufficient in accordance with some embodiments to input a common signal, such as the control signal SCLKEN, into an interface circuit which is configured to internally generate the signals SCLK, WLR and/or WLP for controlling an access operation, based on the control signal SCLKEN. In some embodiments, the signals SCLK, WLR, WLP are generated based on a single pulse of the control signal SCLKEN. As a result, in one or more embodiments, the number of I/O pins required for receiving control signals is reduced, whereas one or more requirements for correct signal sequence and/or waveform are satisfied, to ensure that the access operation is correctly and/or reliably performed. In at least one embodiment, the reduced number of required I/O pins makes it possible to minimize the area occupied by the interface circuit and/or the memory circuit. In some embodiments, the described one-pulse control avoids or at least reduces the risk of control signals being incorrectly input to the memory circuit which, in turn, avoids or at least reduces the risk of malfunction of the memory circuit. Other effects and/or advantages are achievable in accordance with various embodiments.

Figure 3C:
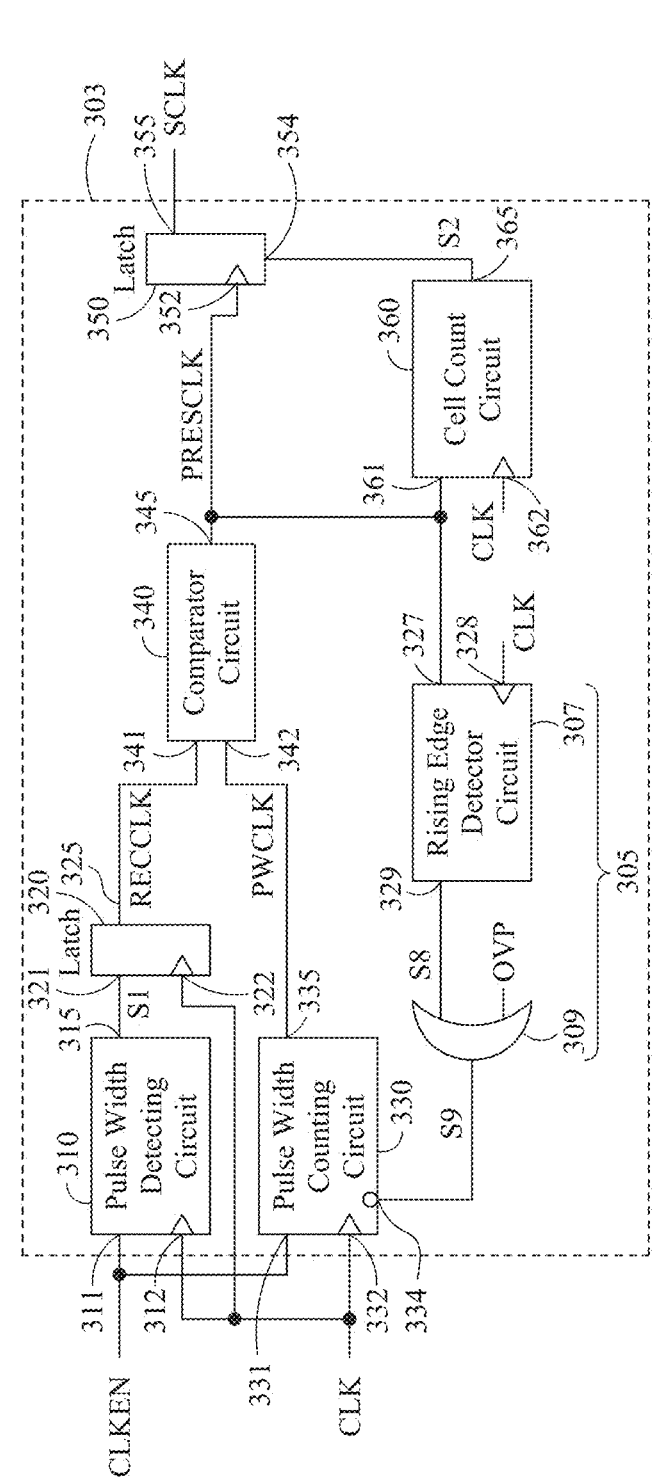
FIG. 3C is a schematic block diagram of an interface circuit of a memory circuit, in accordance with some embodiments.

FIG. 3C is a schematic block diagram of an interface circuit 301 of a memory circuit, in accordance with some embodiments. In at least one embodiment, the interface circuit 301 corresponds to the interface circuit 170, and/or is part of a peripheral circuit of a memory circuit such as the peripheral circuit 160 of the memory circuit 100, or a peripheral circuit of the memory circuit 200. Corresponding elements in FIGS. 3A, 3C are designated by the same reference numerals.

The interface circuit 301 comprises an internal clock generating circuit 303, and the access signal generating circuits 304, 306 as in the interface circuit 300. For simplicity, the access signal generating circuits 304, 306 are not shown in FIG. 3C.

Compared to the internal clock generating circuit 302 in the interface circuit 300, the internal clock generating circuit 303 additionally includes an over-time protection circuit 305 configured to prevent mis-program or mis-read in an over-time situation when a control signal pulse of the control signal SCLKEN is too long, e.g., when the pulse width of the control signal pulse 316 is not shorter than a predetermined time threshold. In the example configuration in FIG. 3C, the over-time protection circuit 305 comprises a rising edge detector circuit 307 and an OR gate 309.

The rising edge detector circuit 307 comprises an input 327 coupled to the output 345 of the comparator circuit 340 to receive the signal PRESCLK, a clock input 328 coupled to the clock signal input CLK, and an output 329 at which a signal S8 is output by the rising edge detector circuit 307. The OR gate 309 comprises a first input coupled to the output 329 of the rising edge detector circuit 307 to receive the signal S8, a second input configured to receive an over-time detection signal OVP, and an output coupled to the reset input 334 of the pulse width counting circuit 330. An example configuration of the rising edge detector circuit 307 is described with respect to FIG. 4K. An example circuit configured to generate the over-time detection signal OVP is described with respect to FIG. 4B. The described configuration of the over-time protection circuit 305 is an example. Other over-time protection circuit configurations are within the scopes of various embodiments.

The rising edge detector circuit 307 is configured to detect a rising edge of the signal PRESCLK at the input 327, and in response to the detected rising edge of the signal PRES-CLK, output the signal S8 having a high level, e.g., logic "1," through the output 329 to the corresponding input of the OR gate 309. The OR gate 309 then outputs a signal S9 of logic "1" to the reset input 334 of the pulse width counting circuit 330 to reset the counted number of the pulse width counting circuit 330, e.g., to zero. This operation similar to that described with respect to the interface circuit 300, and is performed when the over-time detection signal OVP is at logic "0," i.e., an over-time situation is not detected.

When an over-time situation is detected, the over-time detection signal OVP is at logic "1," the signal S9 at the output of the OR gate 309 and the reset input 334 is kept at logic "1," and the pulse width counting circuit 330 is kept in the reset state and keeps the signal PWCLK at logic "0." In response to the signal PWCLK being kept at logic "0," the comparator circuit 340 keeps the signal PRESCLK at logic "0," i.e., PRESCLK pulses are not output. As a result, the output circuit 350 keeps the internal clock signal SCLK at logic "0," i.e., internal clock pulses SCLK are not output. As described with respect to FIG. 2B and/or FIG. 4A, the internal clock pulses SCLK are used for generation of BL selection signals for selecting bit lines coupled to memory cells MC to be accessed. When no internal clock pulses SCLK are output, BL selection signals are not generated and a read operation and/or a program operation of memory cells MC in the memory array 230 is/are not performed, to prevent mis-program or mis-read due to the detected over-time situation in at least one embodiment. Other effects and/or advantages are achievable in accordance with various embodiments.

FIG. 4A is a schematic circuit diagram of a BL selection signal generating circuit 400A, in accordance with some embodiments. In some embodiments, the BL selection signal generating circuit 400A is part of an interface circuit described herein, such as the interface circuit 170 and/or the interface circuit 300. In at least one embodiment, the BL selection signal generating circuit 400A is part of a peripheral circuit outside the interface circuit. The BL selection signal generating circuit 400A is configured to generate the BL selection signals SBL <1:M> described with respect to FIG. 2B, based on the internal clock pulses SCLK described with respect to FIG. 3B. In the example configuration in FIG. 4A, the BL selection signal generating circuit 400A comprises a shift register. Other circuit configurations are within the scopes of various embodiments.

The BL selection signal generating circuit 400A comprises a plurality of flip-flops FF0, FF1, FF2 to FFM coupled in series. In the example configuration in FIG. 4A, the flip-flops FF0, FF1, FF2 to FFM comprise D flip-flops. Other flip-flop configurations are within the scopes of various embodiments. A data input D of the flip-flop FF0 is grounded, whereas a data input D of each of the flip-flops FF1, FF2 to FFM is coupled to a data output Q of the preceding flip-flop. For example, the data input D of the flip-flop FF1 is coupled to the data output Q of the flip-flop FF0, the data input D of the flip-flop FF2 is coupled to the data output Q of the flip-flop FF1, or the like. Inverted data outputs (Q bar) of the flip-flops FF0, FF1, FF2 to FFM are unused. Clock inputs of the flip-flops FF0, FF1, FF2 to FFM are coupled to the output 355 of the internal clock generating circuit 302 to receive the internal clock signal SCLK. A set input of the flip-flop FF0 and reset inputs of the flip-flops FF1, FF2 to FFM are coupled to receive a signal RST. In some embodiments, the signal RST is provided through an I/O pin, such as one of the I/O pins 173. In at least one embodiment, the signal RST is generated by the peripheral circuit of the memory circuit. The data outputs Q of the flip-flops FF1, FF2 to FFM correspond to the BL selection signals SBL<1> to SBL<M>.

At a beginning of an access operation, the signal RST is applied to the set input of the flip-flop FF0 and the reset inputs of the flip-flops FF1, FF2 to FFM, and causes the data output Q of the flip-flop FF0 to have a first logic state, e.g., logic "1," and data outputs Q of the flip-flops FF1, FF2 to FFM to have a second logic state, e.g., logic "0." In response to each pulse of the internal clock signal SCLK, a logic state at the data output Q of each flip-flop is shifted to the data output Q of the subsequent flip-flop. For example, in response to a first internal clock pulse SCLK, logic "1" at the data output Q of the flip-flop FF0 is shifted to the data output Q of the flip-flop FF1, resulting in the BL selection signal SBL<1> being logic "1" which, in turn, corresponds to selection of the bit line BL[1] in the memory circuit 200 in FIG. 2B. The data output Q of the flip-flop FF0 becomes logic "0" which corresponds to the data input D of the flip-flop FF0 being grounded. In response to a second internal clock pulse SCLK, logic "1" at the data output Q of the flip-flop FF1 is shifted to the data output Q of the flip-flop FF2, resulting in the BL selection signal SBL<2> being logic "1" which, in turn, corresponds to selection of a bit line BL[2] (not shown) in the memory circuit 200. As a result, in response to M internal clock pulses SCLK, the BL selection signal generating circuit 400A is configured to sequentially generate M BL selection signals SBL <1:M> which, in turn, corresponds to sequential selection of M bit lines in the memory circuit 200.

FIG. 4B is a schematic circuit diagram of a pulse width detecting circuit 400B, in accordance with some embodiments. In some embodiments, the pulse width detecting circuit 400B corresponds to the pulse width detecting circuit 310, and includes inputs and an output corresponding to the input 311, clock input 312, and output 315 of the pulse width detecting circuit 310. The pulse width detecting circuit 400B comprises a ripple counter 410, a multiplexer MUX1, a comparator circuit COMP1, and a switch SW1. The multiplexer MUX1, comparator circuit COMP1, switch SW1 configure an over-time detection circuit 405. In some embodiments, the over-time detection circuit 405 is configured to cooperate with the over-time protection circuit 305 to provide over-time protection as described herein. The over-time detection circuit 405 is omitted in one or more embodiments, for example, when the over-time protection circuit 305 is not included in the interface circuit. Other over-time detection circuit configurations are within the scopes of various embodiments.

The ripple counter 410 comprises an input corresponding to the input 311, a clock input corresponding to the clock input 312, and an output 415. In one or more embodiments where the over-time detection circuit 405 is omitted, the output 415 corresponds to the output 315. An example configuration of the ripple counter 410 is described with respect to FIG. 4I. The ripple counter 410 is an example of a counter circuit of the pulse width detecting circuit 400B. Other counter circuit configurations are within the scopes of various embodiments.

The multiplexer MUX1 comprises a plurality of inputs (not numbered) configured to receive a plurality of different time values Time_1, Time_2 to Time_n, where n is a natural number. In some embodiments, time values Time_1, Time_2 to Time_n are arranged in the ascending order, i.e., Time_1 is smaller than Time_2, and Time_n is the largest time value. The multiplexer MUX1 further comprises a selection input (not numbered) configured to receive a selection signal SEL_1, and an output (not numbered). In some embodiments, one or more or all of the time values Time_1, Time_2 to Time_n and the selection signal SEL_1 are set or generated in the interface circuit or the peripheral circuit of the memory circuit. In at least one embodiment, one or more or all of the time values Time_1, Time_2 to Time_n and the selection signal SEL_1 are input to the memory circuit through one or more I/O pins, such as one or more of the I/O pins 173. In an example configuration, the time values Time_1, Time_2 to Time_n are included in the interface circuit or the peripheral circuit, whereas the selection signal SEL_1 is input to the memory circuit through an I/O pin.

The comparator circuit COMP1 comprises a first input 416 coupled to the output 415 of the ripple counter 410, a second input 417 coupled to the output of the multiplexer MUX1, and an output configured to output the over-time detection signal OVP. In at least one embodiment, the output of the comparator circuit COMP1 is coupled to the corresponding input of the OR gate 309, to provide the over-time detection signal OVP to the over-time protection circuit 305. In the example configuration in FIG. 4B, the comparator circuit COMP1 comprises an operational amplifier. Other comparator circuit configurations are within the scopes of various embodiments.

The switch SW1 is coupled between the output 415 of the ripple counter 410 and the output 315 of the pulse width detecting circuit 400B. A control terminal 419 of the switch SW1 is coupled to the output of the comparator circuit COMP1. In the example configuration in FIG. 4B, the switch SW1 is a normally-closed switch. A normally-open switch is within the scopes of one or more embodiments. The normally-closed switch SW1 normally couples the output 415 of the ripple counter 410 to the output 315 of the pulse width detecting circuit 400B. An example configuration of the switch SW1 comprises a transistor, e.g., a PMOS transistor. Other switch configurations are within the scopes of various embodiments.

In an access operation in accordance with some embodiments, in response to the rising edge 318 of the control signal pulse 316 of the control signal SCLKEN arriving at the input 311, the ripple counter 410 is configured to start counting a number of clock pulses CLK at the clock input 312. In response to the falling edge 319 of the control signal pulse 316, the ripple counter 410 is configured to stop counting, and maintain or latch a counted number of clock pulses CLK. During the counting operation of the ripple counter 410, the counted number of clock pulses CLK is output as a signal S5 at the output 415 and increases.

In response to the selection signal SEL_1, the multiplexer MUX1 is configured to output a time threshold T_Thres at the output thereof. The time threshold T_Thres corresponds to one of the time values Time_1, Time_2 to Time_n, or a combination of more than one of the time values Time_1, Time_2 to Time_n. The time threshold T_Thres is therefore adjustable by selecting a desired selection signal SEL_1. For example, in response to the selection signal SEL_1 having a first value, a shorter time value, e.g., Time_1 is output as the time threshold T_Thres, and, in response to the selection signal SEL_1 having a second value different from the first value, a longer time value, e.g., Time_2 is output as the time threshold T_Thres, or the like. The comparator circuit COMP1 is configured to compare the increasing counted number in the signal S5 output by the ripple counter 410 to the first input 416 with the time threshold T_Thres output by the multiplexer MUX1 to the second input 417.

When the pulse width of the control signal pulse 316 is shorter than the time threshold T_Thres, the ripple counter 410 is configured to stop counting before the counted number in the signal S5 becomes equal to or greater than the time threshold T_Thres. In this situation, the comparator circuit COMP1 is configured to maintain the switch SW1 in the closed state, e.g., by outputting logic "0" of the over-time detection signal OVP to the control terminal 419. The final counted number in the signal S5 when the ripple counter 410 stops counting is output through the closed switch SW1 to the output 315 as the signal S1, and then to the storage circuit 320. The final counted number is stored in the storage circuit 320 as the detected pulse width PW of the control signal pulse 316. A series of internal clock pulses SCLK is generated based on the stored detected pulse width PW, as described with respect to FIGS. 3A, 3B.

When the pulse width of the control signal pulse 316 is not shorter than the time threshold T_Thres, i.e., in an over-time situation, the counted number in the signal S5 becomes equal to or greater than the time threshold T_Thres. In this situation, the comparator circuit COMP1 is configured to switch the switch SW1 to the open state, e.g., by outputting logic "1" of the over-time detection signal OVP to the control terminal 419. The open switch SW1 disconnects the output 415 and the counted number in the signal S5 at the output 415 from the output 315 and the storage circuit 320. The over-time detection signal OVP at logic "1" is also supplied to the corresponding input of the OR gate 309 which, as described with respect to FIG. 3C, keeps the signal PRESCLK, the signal PWCLK and the internal clock signal SCLK at logic "0". No internal clock pulses SCLK are output, and over-time protection is achieved to prevent malfunction due to the control signal pulse 316 being too long.

In at least one embodiment, the described configuration with multiple time values Time_1, Time_2 to Time_n and the selection signal SEL_1 for outputting the time threshold T_Thres based on the time values Time_1, Time_2 to Time_n and the selection signal SEL_1 improves tunability or customizability of the pulse width detecting circuit 400B and/or the interface circuit or peripheral circuit comprising the pulse width detecting circuit 400B. In some embodiments, the time threshold T_Thres is adjusted to be longer when the program voltage and/or the read voltage is/are low, and to be shorter when the program voltage and/or the read voltage is/are high. In some embodiments, by providing the selection signal SEL_1 from external circuitry and/or external equipment, it is possible to adjust the time threshold T_Thres for optimal over-time protection. In at least one embodiment, one or more advantages described herein are achievable by an interface circuit comprising the pulse width detecting circuit 400B.

FIG. 4C is a schematic circuit diagram of a pulse width counting circuit 400C, in accordance with some embodiments. In some embodiments, the pulse width counting circuit 400C corresponds to the pulse width counting circuit 330, and includes inputs and an output corresponding to the input 331, clock input 332, reset input 334, and output 335 of the pulse width counting circuit 330. The pulse width counting circuit 400C comprises a falling edge detector circuit 430, and a ripple counter 440.

The falling edge detector circuit 430 comprises an input corresponding to the input 331, a clock input corresponding to the clock input 332, and an output 435. An example configuration of the falling edge detector circuit 430 is described with respect to FIG. 4J.

The ripple counter 440 comprises an input 441 coupled to the output 435 of the falling edge detector circuit 430, a clock input 442 coupled to the clock signal input CLK, a reset input corresponding to the reset input 334, and an output corresponding to the output 335. An example configuration of the ripple counter 440 is described with respect to FIG. 4I. The ripple counter 440 is an example of a counter circuit of the pulse width counting circuit 400C. Other counter circuit configurations are within the scopes of various embodiments.

The falling edge detector circuit 430 is configured to detect the falling edge 319 of the control signal pulse 316, and generate at the output 435 a signal S6 having at least one pulse corresponding to the detected falling edge 319. For example, in response to a high level or logic "1" of the signal S6, the ripple counter 440 is enabled. The enabled ripple counter 440 is configured to count the number of clock pulses CLK at the clock input 442, and output the counted number of clock pulses CLK as the signal PWCLK at the output 335. As described herein, when the counted number of clock pulses CLK represented by the signal PWCLK becomes equal to the detected pulse width PW stored in the storage circuit 320 and represented by the signal RECCLK, a comparator circuit, such as the comparator circuit 340, is configured to output a PRESCLK pulse. The PRESCLK pulse as described with respect to FIG. 3A (or the signal S9 as described with respect to FIG. 3C) is applied to the reset input 334 and resets the counted number of the pulse width counting circuit 400C to zero. When over-time protection is not invoked (e.g., the pulse width PW of the control signal pulse 316 is at or below a predetermined time threshold) or not provided (e.g., the over-time protection circuit 305 and/or over-time detection circuit 405 is/are omitted), the pulse width counting circuit 400C is then configured to count again up to the detected pulse width PW stored in the storage circuit 320, and the described process is repeated. When over-time protection is invoked, the pulse width counting circuit 400C is kept in the reset state and the signal PWCLK is kept at the low level. In at least one embodiment, one or more advantages described herein are achievable by an interface circuit comprising the pulse width counting circuit 400C.

FIG. 4D is a schematic circuit diagram of a cell count circuit 400D, in accordance with some embodiments. In some embodiments, the cell count circuit 400D corresponds to the cell count circuit 360, and includes inputs and an output corresponding to the input 361, clock input 362, and output 365 of the cell count circuit 360. The cell count circuit 400D comprises a ripple counter 460, a multiplexer MUX2, a comparator circuit COMP2, and a switch SW2.

The ripple counter 460 comprises an input corresponding to the input 361, a clock input corresponding to the clock input 362, and an output 465. An example configuration of the ripple counter 460 is described with respect to FIG. 4I. The ripple counter 460 is an example of a counter circuit of the cell count circuit 400D. Other counter circuit configurations are within the scopes of various embodiments.

The multiplexer MUX2 comprises a plurality of inputs (not numbered) configured to receive a plurality of different cell count values Count_1, Count_2 to Count_m, where m is a natural number. In some embodiments, cell count values Count_1, Count_2 to Count_m are arranged in the ascending order, i.e., Count_1 is smaller than Count_2, and Count_m is the largest cell count value. The multiplexer MUX2 further comprises a selection input (not numbered) configured to receive a selection signal SEL_2, and an output (not numbered). In some embodiments, one or more or all of the cell count values Count_1, Count_2 to Count_m and the selection signal SEL_2 are set or generated in the interface circuit or the peripheral circuit of the memory circuit. In at least one embodiment, one or more or all of the cell count values Count_1, Count_2 to Count_m and the selection signal SEL_2 are input to the memory circuit through one or more I/O pins, such as one or more of the I/O pins 173. In an example configuration, the cell count values Count_1, Count_2 to Count_m are included in the interface circuit or the peripheral circuit, whereas the selection signal SEL_2 is input to the memory circuit through an I/O pin.

The comparator circuit COMP2 comprises a first input 466 coupled to the output 465 of the ripple counter 460, a second input 467 coupled to the output of the multiplexer MUX2, and an output (not numbered). In the example configuration in FIG. 4D, the comparator circuit COMP2 comprises an operational amplifier. Other comparator circuit configurations are within the scopes of various embodiments.

The switch SW2 is coupled between the output 465 of the ripple counter 460 and the output 365 of the cell count circuit 400D. A control terminal 469 of the switch SW2 is coupled to the output of the comparator circuit COMP2. In the example configuration in FIG. 4D, the switch SW2 is a normally-open switch. A normally-closed switch is within the scopes of one or more embodiments. The normally-open switch SW2 normally disconnects the output 465 of the ripple counter 460 to the output 365 of the cell count circuit 400D. An example configuration of the switch SW2 comprises a transistor, e.g., an NMOS transistor. Other switch configurations are within the scopes of various embodiments.

In an access operation in accordance with some embodiments, in response to a rising edge of a first pulse in the signal PRESCLK arriving at the input 361, the ripple counter 460 is configured to start counting a clock pulse CLK at the clock input 362. In response to a falling edge of the PRESCLK pulse, the cell count circuit 400D is configured to stop counting, but maintain or latch a counted number of clock pulses CLK.

In response to a rising edge of a next pulse in the signal PRESCLK arriving at the input 361, the ripple counter 460 is configured to continue counting, or increment, from the latched counted number of clock pulses CLK.

In at least one embodiment, a pulse width of each pulse in the signal PRESCLK corresponds to a clock period of the clock signal CLK. For each pulse in the signal PRESCLK, the ripple counter 460 counts one clock pulse CLK and increment the counted number of clock pulses CLK by one. In other words, the ripple counter 460 is configured to count the number of pulses in the signal PRESCLK, which corresponds to the number of internal clock pulses SCLK output at the output 355. During the counting operation of the ripple counter 460, the counted number is output as a signal S7 at the output 465 and increases.

In response to the selection signal SEL_2, the multiplexer MUX2 is configured to output a threshold C_Thres at the output thereof. The threshold C_Thres corresponds to one of the cell count values Count_1, Count_2 to Count_m, or a combination of more than one of the cell count values Count_1, Count_2 to Count_m. The threshold C_Thres is therefore adjustable by selecting a desired selection signal SEL_2. For example, in response to the selection signal SEL_2 having a first value, a smaller cell count value, e.g., Count_1 is output as the threshold C_Thres, and, in response to the selection signal SEL_2 having a second value different from the first value, a greater cell count value, e.g., Count_2 is output as the threshold C_Thres, or the like. The comparator circuit COMP2 is configured to compare the increasing counted number in the signal S7 output by the ripple counter 460 to the first input 466 with the threshold C_Thres output by the multiplexer MUX2 to the second input 467. In some embodiments, the threshold C_Thres corresponds to a number of memory cells, or a number of bit lines, being accessible in the access operation.

When the counted number in the signal S7 output by the ripple counter 460 is smaller than the threshold C_Thres, the comparator circuit COMP2 is configured to maintain the switch SW2 in the open state, e.g., by outputting logic "0" to the control terminal 469. The output 465 remains disconnected from the output 365, and the signal S2 at the output 365 remains at an inactive level or inactive logic state.

When increasing the counted number in the signal S7 output by the ripple counter 460 reaches the threshold C_Thres, the comparator circuit COMP2 is configured to switch the switch SW2 to the closed state, e.g., by outputting logic "1" to the control terminal 469. The closed switch SW2 connects the output 465 to the output 365, thereby causing the signal S2 to have an active level or an active logic state which is applied to the enable input 354 of the output circuit 350 to stop the output circuit 350 from outputting further internal clock pulses SCLK. As a result, the number of internal clock pulses SCLK generated by the interface circuit is controlled by the threshold C_Thres and/or the selection signal SEL_2 to correspond to the number of memory cells, or the number of bit lines, being accessible in the access operation.

In at least one embodiment, the described configuration with multiple cell count values Count_1, Count_2 to Count_m and the selection signal SEL_2 for outputting the threshold C_Thres based on the cell count values Count_1, Count_2 to Count_m and the selection signal SEL_2 improves tunability or customizability of the cell count circuit 400D and/or the interface circuit or peripheral circuit comprising the cell count circuit 400D. In some embodiments, the threshold C_Thres is adjusted, by an appropriate selection signal SEL_2, to correspond to a memory cell density in the memory circuit to be accessed. As a result, in one or more embodiments, it is possible to avoid generating unnecessary internal clock pulses SCLK, e.g., more internal clock pulses SCLK than the number of accessible bit lines, thereby reducing power consumption and/or improving program or read speed. Coupled with the reduced I/O pin count with area improvements, PPA optimization is achievable in one or more embodiments. In at least one embodiment, one or more advantages described herein are achievable by an interface circuit comprising the cell count circuit 400D.

Figures 4E, 4F:
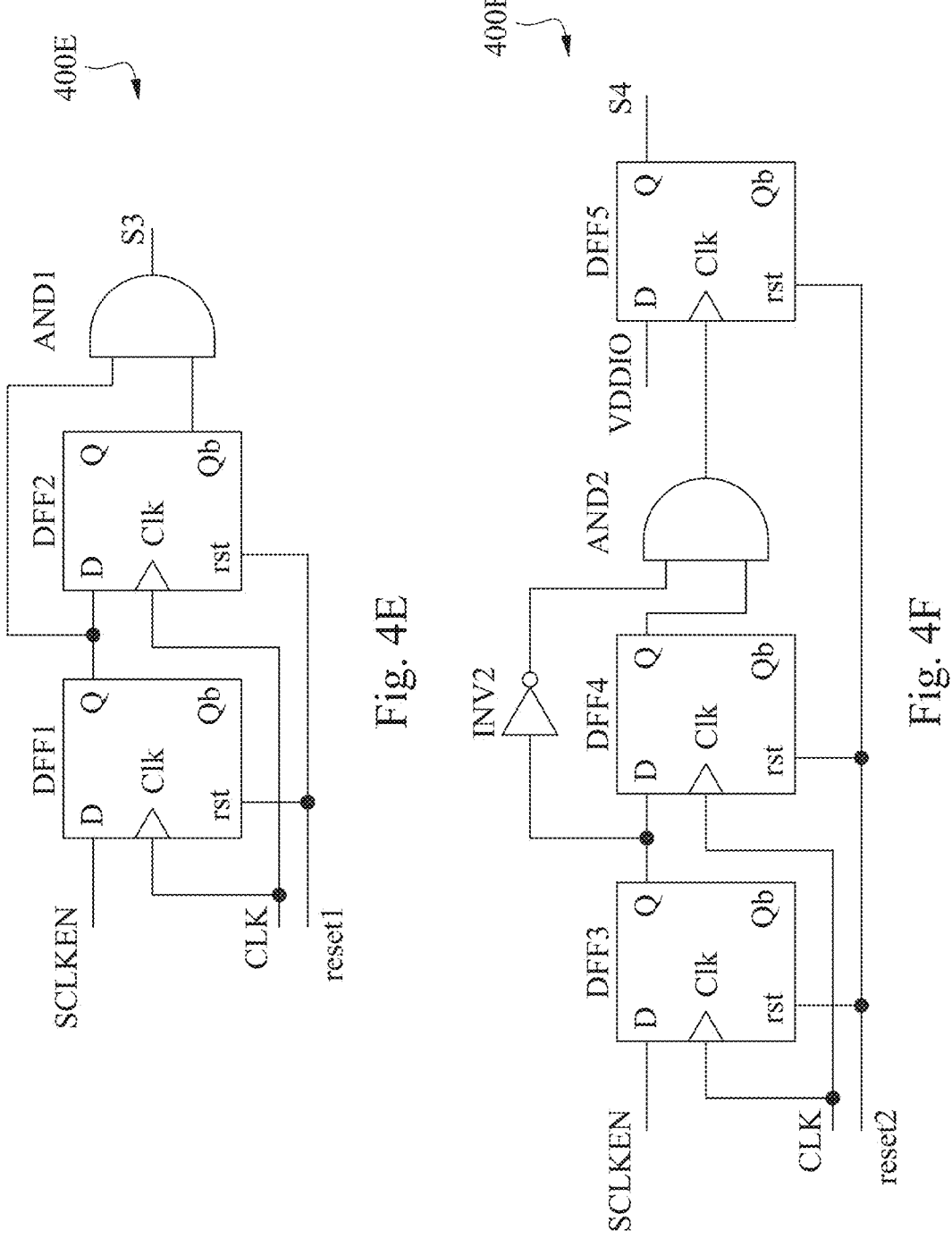

FIG. 4E is a schematic circuit diagram of a rising edge detector circuit 400E, in accordance with some embodiments. In some embodiments, the rising edge detector circuit 400E corresponds to the rising edge detector circuit 370.

The rising edge detector circuit 400E comprises D flip-flops DFF1, DFF2, and an AND gate AND1. Each of the flip-flops DFF1, DFF2 comprises a data input (labelled as "D" in the figure), a clock input (labelled as "clk" in the figure), a reset input (labelled as "rst" in the figure), an output (labelled as "Q" in the figure), and an inverted output (labelled as "Qb" in the figure). The flip-flop DFF1 has the data input coupled to receive the control signal SCLKEN, the clock input coupled to receive the clock signal CLK, the reset input coupled to receive the reset signal reset1, and the output coupled to the data input of the flip-flop DFF2 and a first input of the gate AND1. The flip-flop DFF2 has the clock input coupled to receive the clock signal CLK, the reset input coupled to receive the reset signal reset1, and the inverted output coupled to a second input of the gate AND1. The described configuration is an example. Other rising edge detector circuit configurations are within the scopes of various embodiments.

The rising edge detector circuit 400E is configured to detect the rising edge of the control signal SCLKEN arriving at the data input of the flip-flop DFF1, and output the signal S3 at the output of the gate AND1. As a result, the access signal WLR corresponding to the signal S3 is raised to logic "1" in response to the rising edge of the control signal SCLKEN. The access signal WLR remains at logic "1" until the reset signal reset1 arrives at the reset inputs of the flip-flops DFF1, DFF2. The reset signal reset1 resets the rising edge detector circuit 400E and the signal S3, and as a result, the access signal WLR is reset to logic "0". In at least one embodiment, one or more advantages described herein are achievable by an interface circuit comprising the rising edge detector circuit 400E.

FIG. 4F is a schematic circuit diagram of a falling edge detector circuit 400F, in accordance with some embodiments. In some embodiments, the falling edge detector circuit 400F corresponds to the falling edge detector circuit 390.

The falling edge detector circuit 400F comprises D flip-flops DFF3, DFF4, DFF5, an inverter INV2, and an AND gate AND2. Each of the flip-flops DFF3-DFF5 comprises a data input, a clock input, a reset input, an output, and an inverted output as described with respect to the flip-flops DFF1, DFF2. The flip-flop DFF3 has the data input coupled to receive the control signal SCLKEN, the clock input coupled to receive the clock signal CLK, the reset input coupled to receive the reset signal reset2, and the output coupled to the data input of the flip-flop DFF4 and an input of the inverter INV2. An output of the inverter INV2 is coupled to a first input of the gate AND2. The flip-flop DFF4 has the clock input coupled to receive the clock signal CLK, the reset input coupled to receive the reset signal reset2, and the inverted output coupled to a second input of the gate AND2. The flip-flop DFF5 has the data input coupled to receive a reference voltage, such as the power supply voltage VDDIO, the clock input coupled to an output of the gate AND2, and the reset input coupled to receive the reset signal reset2. The described configuration is an example. Other falling edge detector circuit configurations are within the scopes of various embodiments.

The falling edge detector circuit 400F is configured to detect the falling edge of the control signal SCLKEN arriving at the data input of the flip-flop DFF3, and output the signal S4 at the output of the flip-flop DFF5. As a result, the access signal WLP corresponding to the signal S4 is raised to logic "1" in response to the falling edge of the control signal SCLKEN. The access signal WLP remains at logic "1" until the reset signal reset2 arrives at the reset inputs of the flip-flops DFF3-DFF5. The reset signal reset2 resets the falling edge detector circuit 400F and the signal S4, and as a result, the access signal WLP is reset to logic "0". In at least one embodiment, one or more advantages described herein are achievable by an interface circuit comprising the falling edge detector circuit 400F.

Figure 4H:
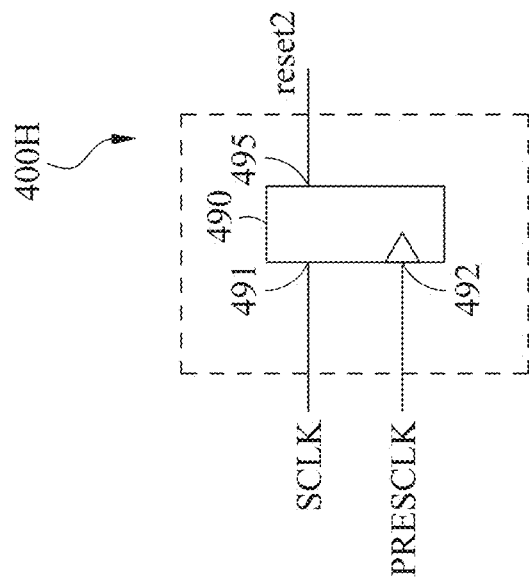
Figure 4G:
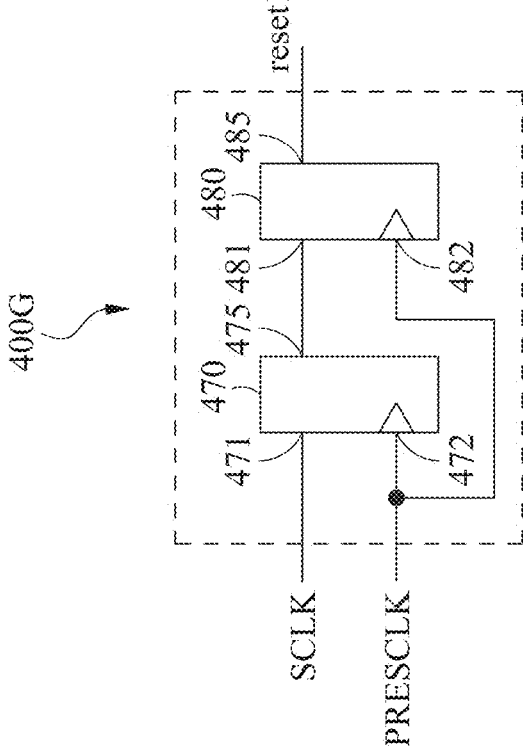
Figure 41:
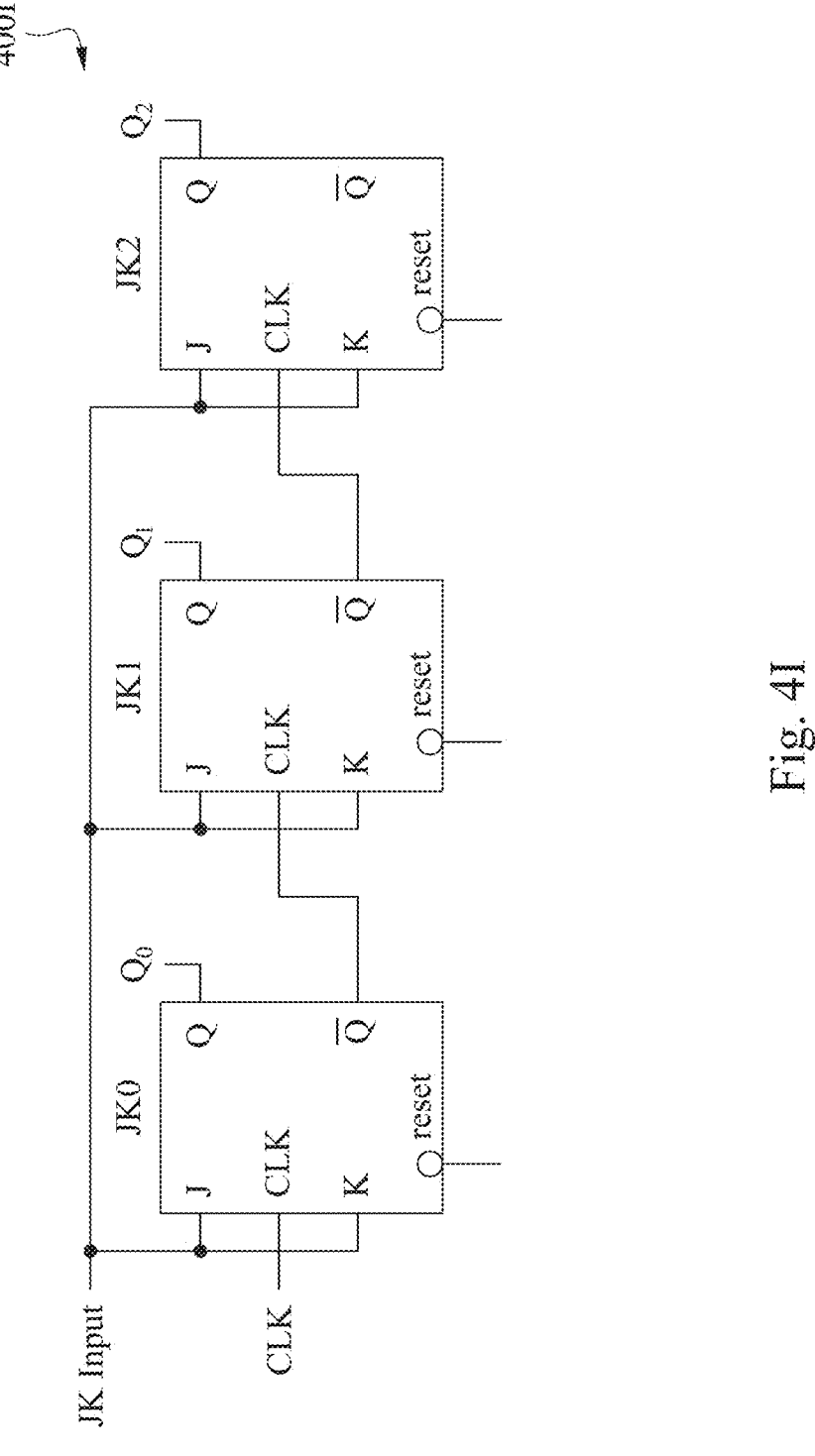

FIG. 4G is a schematic circuit diagram of a circuit 400G configured to generate the reset signal reset1, in accordance with some embodiments.

The circuit 400G comprises latch circuits 470, 480 coupled in series. The latch circuit 470 comprises an input 471 coupled to receive the internal clock signal SCLK, a clock input 472 coupled to receive the signal PRESCLK, and an output 475. The latch circuit 480 comprises an input 481 coupled to the output 475 of the latch circuit 470, a clock input 482 coupled to receive the signal PRESCLK, and an output 485 at which the circuit 400G is configured to generate the reset signal reset1. In at least one embodiment, the latch circuits 470, 480 are replaced by flip-flops. The described circuit for generating the reset signal reset1 is an example. Other configurations are within the scopes of various embodiments.

FIG. 4H is a schematic circuit diagram of a circuit 400H configured to generate the reset signal reset2, in accordance with some embodiments.

The circuit 400H comprises a latch circuit 490. The latch circuit 490 comprises an input 491 coupled to receive the internal clock signal SCLK, a clock input 492 coupled to receive the signal PRESCLK, an output 495 at which the circuit 400H is configured to generate the reset signal reset2. In at least one embodiment, the latch circuit 490 is replaced by a flip-flop. The described circuit for generating the reset signal reset2 is an example. Other configurations are within the scopes of various embodiments.

In an example operation of the circuit 400H, the reset signal reset2 has a first level or logic state, when both an internal clock pulse SCLK and a PRESCLK pulse are input to the latch circuit 490. When output of internal clock pulses SCLK is stopped, e.g., by the signal S2 as described herein, a PRESCLK pulse is applied to the clock input 492, but no internal clock pulse SCLK is applied to the input 491. The reset signal reset2 is switched to a second level or logic state, different from the first level or logic state, on a second PRESCLK pulse after output of the internal clock pulses SCLK is stopped. The switched level or logic state of the reset signal reset2 causes the falling edge detector circuit 390 or the falling edge detector circuit 400F to be reset, resulting in a falling edge of the access signal WLP, as described herein.

In an example operation, the circuit 400G is configured to operate similarly to the circuit 400H. However, the presence of the additional latch circuit 480 causes the reset signal reset1 to be switched to a different level or logic state on a third PRESCLK pulse after output of the internal clock pulses SCLK is stopped. The switched level or logic state of the reset signal reset1 causes the rising edge detector circuit 370 or the rising edge detector circuit 400E to be reset, resulting in a falling edge of the access signal WLR after the falling edge of the access signal WLP, as described herein.

In at least one embodiment, one or more advantages described herein are achievable by an interface circuit comprising the circuit 400G and/or the circuit 400H.

FIG. 4I is a schematic circuit diagram of a ripple counter 4001, in accordance with some embodiments. In some embodiments, the ripple counter 4001 corresponds to at least one of the ripple counter 410, the ripple counter 440, or the ripple counter 460.

The ripple counter 4001 comprises a plurality of JK flip-flops JK0, JK1, JK2 coupled in series. Other flip-flop configurations and/or number of flip-flops are within the scopes of various embodiments. For a number k of flip-flops in the ripple counter 4001, the ripple counter 4001 is configured to count from zero to $2^k-1$. J and K inputs of all flip-flops JK0, JK1, JK2 are coupled to receive a JK input signal. A clock input of the flip-flop JK0 is coupled to receive the clock signal CLK. A clock input of each of the flip-flops JK1, JK2 is coupled to an inverted data output (Q bar) of the preceding flip-flop. For example, the clock input of the flip-flop JK1 is coupled to the inverted data output (Q bar) of the flip-flop JK0, the clock input of the flip-flop JK2 is coupled to the inverted data output (Q bar) of the flip-flop JK1, or the like. Data outputs Q of the flip-flops JK0, JK1, JK2 correspond to bits Q0, Q1, Q2 of the number counted by the ripple counter 4001. Each of the flip-flops JK0, JK1, JK2 further comprises a reset input.

In an example operation of each of the flip-flops JK0, JK1, JK2, when the JK input signal is at a high level, levels or logic states of the data output Q and inverted data output (Q bar) are switched in accordance with the signal at the clock input. When the JK input signal is at a low level, the levels or logic states of the data output Q and inverted data output (Q bar) are unchanged.

When the ripple counter 4001 is configured as the ripple counter 410, the JK input signal is the control signal SCLKEN, the reset inputs are unused, and the bits Q0, Q1, Q2 correspond to bits of the counted number in the signal S5. When the ripple counter 4001 is configured as the ripple counter 440, the JK input signal is the signal S6, the reset inputs are coupled to receive the signal PRESCLK, and the bits Q0, Q1, Q2 correspond to bits of the counted number in the signal PWCLK. When the ripple counter 4001 is configured as the ripple counter 460, the JK input signal is the signal PRESCLK, the reset inputs are unused, and the bits Q0, Q1, Q2 correspond to bits of the counted number in the signal S7. In at least one embodiment, one or more advantages described herein are achievable by an interface circuit comprising the ripple counter 4001.

Figures 4J, 4K:
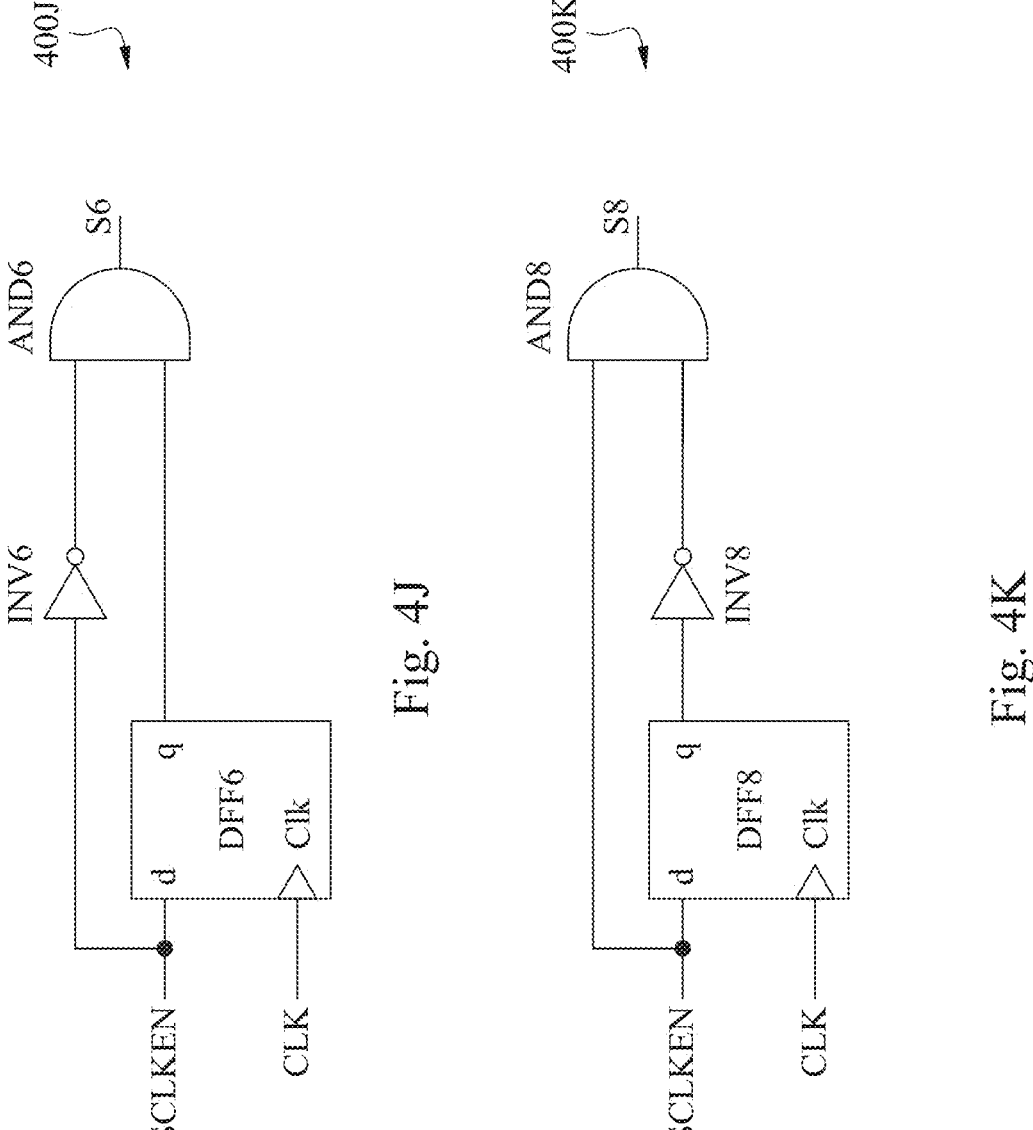

FIG. 4J is a schematic circuit diagram of a falling edge detector circuit 400J, in accordance with some embodiments. In some embodiments, the falling edge detector circuit 400J corresponds to the falling edge detector circuit 430.

The falling edge detector circuit 400J comprises a D flip-flop DFF6, an inverter INV6, and an AND gate AND6. In some embodiments, the flip-flop DFF6 is configured similarly to the flip-flops DFF1-DFF5. The flip-flop DFF6 comprises an input coupled to receive the control signal SCLKEN, a clock input coupled to receive the clock signal CLK, and an output.

The inverter INV6 comprises an input coupled to the input of the flip-flop DFF6 and to receive the control signal SCLKEN, and an output. The gate AND6 comprises a first input coupled to the output of the inverter INV6, a second input coupled to the output of the flip-flop DFF6, and an output at which the falling edge detector circuit 400J is configured to output the signal S6. In some embodiments, the signal S6 comprises a pulse having a rising edge corresponding to the falling edge 319 of the control signal pulse 316, and a duration corresponding to a time period when the outputs of the inverter INV6 and the flip-flop DFF6 both have a high level, e.g., logic "1." Other falling edge detector circuit configurations are within the scopes of various embodiments. In at least one embodiment, one or more advantages described herein are achievable by an interface circuit comprising the falling edge detector circuit 400J.

FIG. 4K is a schematic circuit diagram of a rising edge detector circuit 400K, in accordance with some embodiments. In some embodiments, the rising edge detector circuit 400K corresponds to the rising edge detector circuit 307.

The rising edge detector circuit 400K comprises a D flip-flop DFF8, an inverter INV8, and an AND gate AND8. In some embodiments, the flip-flop DFF8 is configured similarly to the flip-flops DFF1-DFF5. The flip-flop DFF8 comprises an input coupled to receive the control signal SCLKEN, a clock input coupled to receive the clock signal CLK, and an output.

The inverter INV8 comprises an input coupled to the output of the flip-flop DFF8, and an output. The gate AND8 comprises a first input coupled to receive the control signal SCLKEN, a second input coupled to the output of the inverter INV8, and an output at which the rising edge detector circuit 400K is configured to output the signal S8. In some embodiments, the signal S8 comprises a pulse having a rising edge corresponding to the rising edge of the signal PRESCLK, and a duration corresponding to a time period when the output of the inverter INV8 and the signal PRESCLK both have a high level, e.g., logic "1." Other rising edge detector circuit configurations are within the scopes of various embodiments. In at least one embodiment, one or more advantages described herein are achievable by an interface circuit comprising the rising edge detector circuit 400K.

The described rising edge detector circuit and falling edge detector circuit are examples of edge detector circuits. In at least one embodiment, one or more of the described rising edges are modifiable to be falling edges and vice versa, and/or one or more of the described rising edge detector circuits are modifiable to be falling edge detector circuits and vice versa.

Figure 5A:
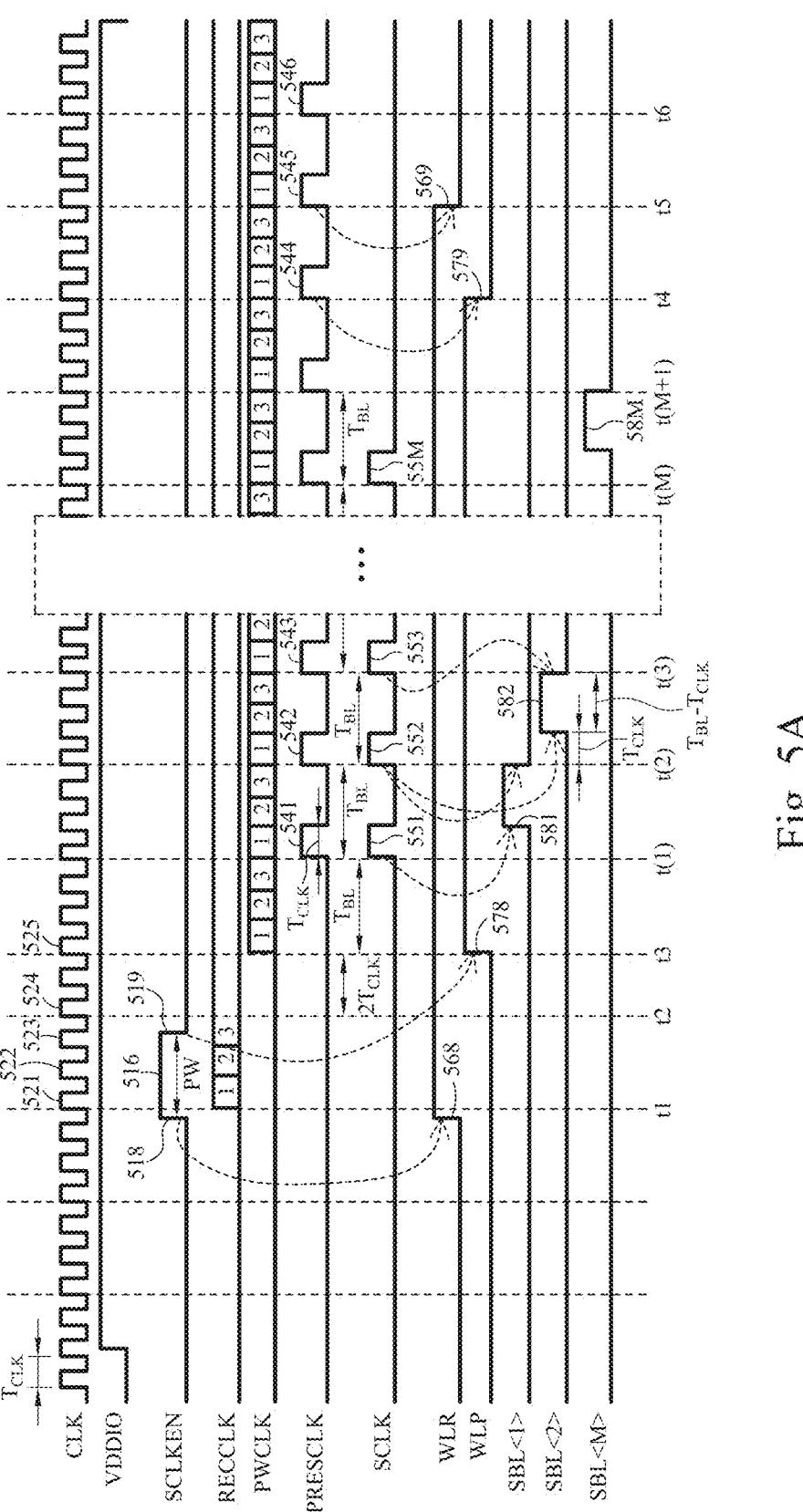
FIGS. 5A-5B are schematic timing diagrams of various operations of an interface circuit and/or a peripheral circuit of a memory circuit, in accordance with some embodiments.
Figure 5B:
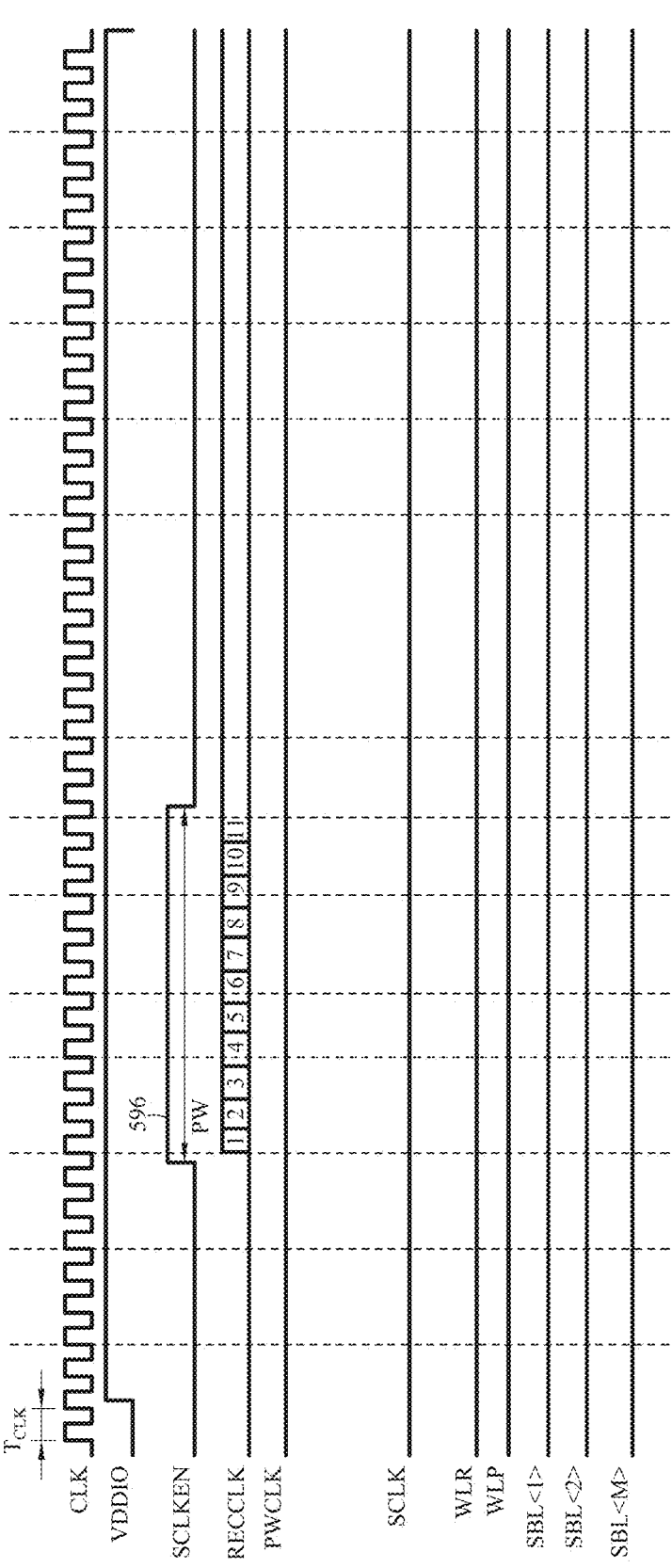

FIGS. 5A-5B are schematic timing diagrams of various operations of an interface circuit and/or a peripheral circuit of a memory circuit, in accordance with some embodiments. In some embodiments, one or more of the operations described with respect to FIGS. 5A-5B are performed at or by one or more of the memory circuit 100, peripheral circuit 160, interface circuit 170, memory circuit 200, interface circuit 300, interface circuit 301, and various circuits described with respect to one or more of FIGS. 4A-4K. Corresponding signals and/or features in FIGS. 5A-5B are designated by the same reference numerals. FIG. 5A illustrates an example situation where over-time protection is not invoked. FIG. 5B illustrates an example situation where over-time protection is invoked.

FIG. 5A includes schematic timing diagrams of various signals in an access operation of one or more memory cells in a row of a memory array in a memory circuit, in accordance with some embodiments. In the example configuration in FIG. 5A, the clock signal CLK, power supply voltage VDDIO, and control signal SCLKEN are input through corresponding I/O pins into an interface circuit of the memory circuit, as described with respect to FIG. 1. The remaining signals, i.e., the signal RECCLK, signal PWCLK, signal PRESCLK, internal clock signal SCLK, access signal WLR, access signal WLP, BL selection signals SBL <1> to SBL<M> are generated by the interface circuit or a peripheral circuit of the memory circuit, based on the clock signal CLK and control signal SCLKEN for performing the access operation.

The clock signal CLK comprises a plurality of clock pulses CLK, with a clock period $T_{CLK}$ between successive clock pulses CLK. Some of the clock pulses CLK are designated in FIG. 5A, e.g., clock pulses 521-525.

The power supply voltage VDDIO provides power required for performing one or more operations described with respect to FIG. 5A.

The control signal SCLKEN comprises a control signal pulse 516 having a rising edge 518, a falling edge 519, and a pulse width PW between the rising edge 518 and falling edge 519. In at least one embodiment, the control signal pulse 516, rising edge 518, falling edge 519 correspond to the control signal pulse 316, rising edge 318, falling edge 319. In the example configuration in FIG. 5A, the control signal SCLKEN is an analog signal, meaning that the rising edge 518 and/or falling edge 519 is/are not necessarily synchronized or aligned with rising edges and/or falling edges of the clock pulses CLK. Other arrangements where at least one of the rising edge 518 or falling edge 519 is synchronized or aligned with a rising edge or a falling edge of a clock pulse CLK are within the scopes of various embodiments.

The signal RECCLK indicates operations at the pulse width detecting circuit 310 and/or pulse width detecting circuit 400B. For example, in response to the rising edge 518 of the control signal pulse 516, the ripple counter 410 is enabled and start counting clock pulses CLK. The clock pulse 521 having a rising edge at timing t1 immediately after the rising edge 518 is the first clock pulse counted. The ripple counter 410 keeps counting clock pulses CLK until the counting operation of the ripple counter 410 is disabled by the falling edge 519. The clock pulses 521, 522, 523 having rising edges falling within the pulse width PW of the control signal pulse 516 are counted. The clock pulse 524 having a rising edge at timing t2 immediately after the falling edge 519, and the subsequent clock pulses CLK, are not counted. The counted number of the ripple counter 410 is stored and output by the storage circuit 320 as the signal RECCLK. As the clock pulses 521, 522, 523 are counted, the counted number is correspondingly reflected in the signal RECCLK as "1," "2," "3," as illustrated in FIG. 5A. When the counting operation of the ripple counter 410 is disabled by the falling edge 519, the last counted number, i.e., "3," is kept by the storage circuit 320 until the end of the access operation.

The number "3" stored in the storage circuit 320 indicates that the pulse width PW of the control signal pulse 516 corresponds to 3 clock periods $T_{CLK}$ (i.e., $3T_{CLK}$). In some embodiments, the stored number "3" does not mean that the pulse width PW is equal to 3 clock periods $T_{CLK}$; instead, it means that 3 clock periods $T_{CLK}$ are an estimate of the pulse width PW. In FIG. 5A, the pulse width PW corresponding to 3 clock periods $T_{CLK}$ is an example. Other values of the pulse width PW are within the scopes of various embodiments.

The signal PWCLK indicates operations at the pulse width counting circuit 330 and/or pulse width counting circuit 400C. For example, the falling edge 519 is detected by the falling edge detector circuit 430. The falling edge detector circuit 430 outputs the signal S6 upon detecting the falling edge 519. The signal S6 enables the ripple counter 440 to start counting clock pulses CLK. The clock pulse 525 having a rising edge at timing t3 is the first clock pulse counted by the ripple counter 440. The timing t3 is about $2T_{CLK}$ after the falling edge 519. This example time delay of about $2T_{CLK}$ is caused at least in part by the operation of the falling edge detector circuit 430. The ripple counter 440 keeps counting "1," "2," "3," as illustrated in FIG. 5A.

The signal PRESCLK indicates operations at the comparator circuit 340. For example, the comparator circuit 340 compares the counted number of the ripple counter 440 with the stored number in the storage circuit 320. Upon the counted number of the ripple counter 440 reaching the stored number, i.e., "3," the comparator circuit 340 raises, at timing t(1), the signal PRESCLK to a high level to start a PRESCLK pulse 541. The high level of the PRESCLK pulse 541 resets the ripple counter 440 which, as shown in the signal PWCLK, restarts, at timing t(1), the counted number thereof from "1." This restarted counted number of "1" is smaller than the stored number of "3" in the storage circuit 320, and, as a result, the comparator circuit 340 drops the signal PRESCLK to a low level, thereby ending the PRES-CLK pulse 541. The pulse width of the PRESCLK pulse 541 is equal to $T_{CLK}$.

The described process is repeated. For example, the ripple counter 440 counts "1," "2," "3," resets, and counts "1," "2," "3," again. Every $3T_{CLK}$, e.g., at timings t(1), t(2), t(3), . . . t(M), t(M+1), t4, t5, t6, a PRESCLK pulse is generated, e.g., PRESCLK pulses 541, 542, 543, 544, 545, 546. Each PRESCLK pulse has a pulse width of $T_{CLK}$, and the PRES-CLK pulses are generated at a period $T_{BL}$ equal to $3T_{CLK}$.

The internal clock signal SCLK indicates operations at the output circuit 350, cell count circuit 360 and/or cell count circuit 400D. For example, at the beginning when the comparator circuit 340 starts outputting PRESCLK pulses, the output circuit 350 generates, for each PRESCLK pulse, a corresponding internal clock pulse SCLK. Each internal clock pulse SCLK has the same pulse width $T_{CLK}$ as the corresponding PRESCLK pulse, and the internal clock pulses SCLK are generated at the same period $T_{BL}$ of the PRESCLK pulses. The period $T_{BL}$ of the internal clock pulses SCLK is referred to as the internal clock period $T_{BL}$. In FIG. 5A, the internal clock pulses SCLK are indicated as 551, 552, 553, . . . 55M at corresponding timings t(1), t(2), t(3), . . . t(M).

The ripple counter 460 counts the number of generated internal clock pulses SCLK, and the comparator circuit COMP2 compares the counted number of the ripple counter 460 with the threshold C_Thres output by the multiplexer MUX2. In an example, the threshold C_Thres is equal to M which is the number of bit lines to be accessed. When M internal clock pulses SCLK have been generated, the counted number of the ripple counter 460 is equal to the threshold C_Thres, the comparator circuit COMP2 closes the switch SW2 to send the signal S2 to stop the output circuit 350 from outputting further internal clock pulses SCLK. As illustrated in FIG. 5A, the last internal clock pulse SCLK is pulse 55M, and no further internal clock pulses SCLK are generated regardless of further PRESCLK pulses, such as pulses 544, 545, 546.

The BL selection signals SBL<1>, SBL<2>, SBL<M> indicate operations at the BL selection signal generating circuit 400A. For example, for each internal clock pulse SCLK, the BL selection signal generating circuit 400A generates a corresponding the BL selection signal. In the example in FIG. 5A, a rising edge of the internal clock pulse 551 causes a rising edge of a corresponding pulse 581 in the BL selection signals SBL<1>, and a rising edge of the internal clock pulse 552 causes a falling edge of the pulse

581. The rising edge of the internal clock pulse 552 also causes a rising edge of a corresponding pulse 582 in the BL selection signals SBL<2>, and a rising edge of the internal clock pulse 553 causes a falling edge of the pulse 582. The described process is repeated, and pulses 581, 582, . . . 58M in the corresponding BL selection signals SBL<1>, SBL<2>, . . . . SBL<M> are generated correspondingly to the internal clock pulses 551, 552, . . . 55M. In some embodiments, the BL selection signals SBL<1>, SBL<2>, . . . . SBL<M> are applied to the BL selection circuit 240 for sequentially selecting or accessing M bit lines BL[1] to BL[M] in the access operation.

A time delay of $T_{CLK}$ exists between the rising edge of each internal clock pulse SCLK (e.g., pulse 552) and the rising edge of the corresponding pulse (e.g., pulse 582) in the corresponding BL selection signal due to the shifting operation in the BL selection signal generating circuit 400A. In at least one embodiment, this time delay of $T_{CLK}$ prevents successive pulses (e.g., 581, 582) in successive BL selection signals (e.g., SBL<1>, SBL<2>) from overlapping each other, to prevent potential malfunction due to such pulse overlapping.

The access signal WLR indicates operations at the access signal generating circuit 304, rising edge detector circuit 400E, and/or circuit 400G. For example, in response to the rising edge 518 of the control signal pulse 516, the rising edge detector circuit 370 raises the access signal WLR to a high level, thereby causing a rising edge 568 of the access signal WLR. In some embodiments, a time delay exists between the rising edge 518 of the control signal pulse 516 and the rising edge 568 of the access signal WLR, and is caused at least in part by the delay circuit 380. The high level of the access signal WLR is maintained until the reset signal reset1 is applied to the rising edge detector circuit 370, thereby causing a falling edge 569 of the access signal WLR. The circuit 400G generates the reset signal reset1 when output of internal clock pulses SCLK is stopped. In an example operation, when both PRESCLK pulses and internal clock pulses SCLK are output (e.g., at t(1), t(2) to t(M) in FIG. 5A), the reset signal reset1 output by the circuit 400G is at the high level, i.e., logic "1," corresponding to the access signal WLR at the high level. When output of the internal clock pulses SCLK is stopped while PRESCLK pulses are still being output ((e.g., at t(M+1), t4, t5, t6 in FIG. 5A), the reset signal reset1 is switched by the circuit 400G to the low level, i.e., logic "0," which resets the rising edge detector circuit 370 and the signal S3, and causes the access signal WLR to switched to logic "0". In the example in FIG. 5A, the reset signal reset1 of logic "0" triggers the falling edge 569 of the access signal WLR which corresponds to the rising edge of the PRESCLK pulse 545 at timing t5.

The access signal WLP indicates operations at the access signal generating circuit 306, falling edge detector circuit 400F, and/or circuit 400H. For example, in response to the falling edge 519 of the control signal pulse 516, the falling edge detector circuit 390 raises the access signal WLP to a high level, thereby causing a rising edge 578 of the access signal WLP. In some embodiments, the time delay between the falling edge 519 of the control signal pulse 516 and the rising edge 578 of the access signal WLP is caused at least in part by the delay circuit 386. The high level of the access signal WLP is maintained until the reset signal reset2 is applied to the falling edge detector circuit 390, thereby causing a falling edge 579 of the access signal WLP. The circuit 400H generates the reset signal reset2 when output of internal clock pulses SCLK is stopped, in a manner similar to that described herein with respect to the reset signal reset1 and the circuit 400G. In the example in FIG. 5A, the reset signal reset2 triggers the falling edge 579 of the access signal WLP which corresponds to the rising edge of the PRESCLK pulse 544 at timing t4. The falling edge 579 of the access signal WLP is generated one $T_{BL}$ after the last pulse (i.e., pulse 58M) of the last BL selection signal SBL<M>. The falling edge 569 of the access signal WLR is generated one $T_{BL}$ after the falling edge 579 of the access signal WLP. The duration of the access signal WLP between the corresponding rising edge 578 and falling edge 579 is completely within the duration of the access signal WLR between the corresponding rising edge 568 and falling edge 569. All internal clock pulses SCLK and the corresponding pulses 581, 582, . . . 58M are generated during the durations of both the access signal WLP and access signal WLR.

In the example in FIG. 5A, the pulse width of the control signal pulse 516 is shorter than the time threshold T_Thres output by the multiplexer MUX1, and over-time protection is not invoked.

In the example in FIG. 5B, a control signal pulse 596 of the control signal SCLKEN is longer than the time threshold T_Thres output by the multiplexer MUX1, and invokes over-time protection. In at least one embodiment, the over-time protection circuit 305 and over-time detection circuit 405 are configured to provide over-time protection, as described with respect to FIGS. 3C, 4B.

In the example configuration in FIG. 5B, the control signal SCLKEN comprises a control signal pulse 596 having a pulse width PW greater than a predetermined time threshold T_Thres. Referring to FIG. 4B, as the ripple counter 410 triggered by the rising edge (not number) of the control signal pulse 596 counts up from "1", "2," "3," . . . the counted number of the ripple counter 410 is still below the time threshold T_Thres, and the switch SW1 remains closed permitting the signal S1 to be output to the storage circuit 320 which stores and outputs the counted number as the signal RECCLK illustrated in FIG. 5B. When the counted number of the ripple counter 410 reaches or exceeds the time threshold T_Thres, e.g., "11" in this example, the comparator circuit COMP1 outputs the over-time detection signal OVP of logic "1" which switches the switch SW1 to the open state, and stops output of further counted numbers to the storage circuit 320. Further, as described with respect to FIG. 3C, the over-time detection signal OVP of logic "1" is supplied to the OR gate 309 and keeps the pulse width counting circuit 330 in the reset state. As result, the signal PWCLK is kept at logic "0," PRESCLK pulses are not output, internal clock pulses SCLK are not output, the access signals WLR, WLP are kept at logic "0," and BL selection signals SBL<1>, SBL<2>, . . . . SBL<M> are not generated, as illustrated in FIG. 5B. In at least one embodiment, one or more advantages described herein are achievable by an interface circuit performing one or more operations described with respect to one or more of FIGS. 5A-5B.

Figure 6A:
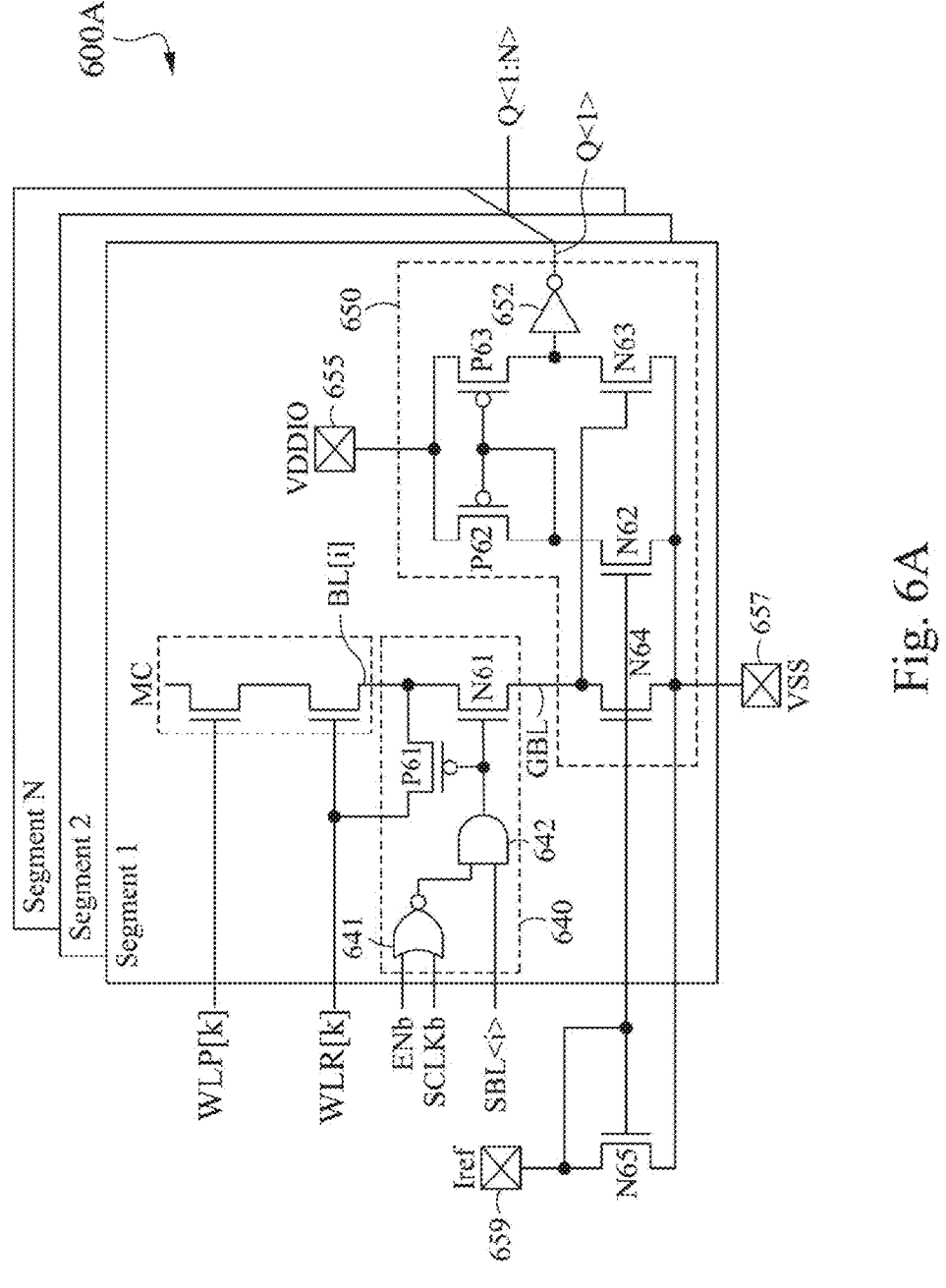
FIGS. 6A-6B are schematic circuit diagrams of various circuits, in accordance with some embodiments.

FIG. 6A is a schematic circuit diagram of a memory circuit 600A, in accordance with some embodiments. In some embodiments, the memory circuit 600A corresponds to at least one of the memory circuit 100 or the memory circuit 200. Corresponding elements in FIGS. 1, 2B, 6A are designated by the same reference numerals.

In FIG. 6A, one memory cell MC with the corresponding read word line WLR[k], program word line WLP[k], and bit line BL[i] in Segment 1 of the memory circuit 600A are illustrated, where k is a natural number between 1 and K, and i is a natural number between 1 and M. For simplicity, other memory cells, word lines and bit lines are omitted. The memory circuit 600A comprises a BL selection circuit 640 and a read/program circuit 650. In some embodiments, the BL selection circuit 640 corresponds to the BL selection circuit 240, and/or the 650 corresponds to the read/program circuit 250.

The BL selection circuit 640 comprises an NOR gate 641, an AND gate 642, a PMOS transistor P61, and an NMOS transistor N61. The NOR gate 641 comprises first and second inputs coupled to correspondingly receive a signal ENb and a signal SCLKb, and an output coupled to a first input of the AND gate 642. The AND gate 642 comprises a second input coupled to receive a BL selection signal SBL <i> corresponding to the bit line BL[i], and an output coupled to gates of the transistor P61, transistor N61. The transistor P61 comprises a first source/drain coupled to the read word line WLR[k], and a second source/drain coupled to the bit line BL[i]. The transistor N61 comprises first and second source/drains correspondingly coupled to the bit line BL[i] and a global bit line GBL.

The read/program circuit 650 comprises PMOS transistors P62-P63, NMOS transistors N62-N64, and an inverter 652. The transistors P62, N62 are coupled in series between a node or I/O pin 655 having the power supply voltage VDDIO, and a node or I/O pin 657 having the ground voltage VSS. The transistors P63, N63 are coupled in series between the node 655 of VDDIO and the node 657 of VSS. Gates of the transistors P62, P63 are coupled together and to a common source/drain of the transistors P62, N62. A common source/drain of the transistors P63, N63 is coupled to an input of the inverter 652. A gate of the transistor N63 is coupled to the global bit line GBL. Gates of the transistors N62, N64 are coupled together and to a gate of an NMOS transistor N65 outside Segment 1 of the memory circuit 600A. The transistor N64 is coupled between the global bit line GBL and the node 657 of VSS. The transistor N65 is coupled into a resistor between a node or I/O pin 659 and the node 657 of VSS. The node 659 is configured to receive a reference current Iref. The inverter 652 comprises an output at which read data Q<1> is to be output, as described with respect to FIG. 2B. In the example configuration in FIG. 6A, the read/program circuit 650 comprises a sense amplifier configured to output read data Q<1> by detecting a read current on the global bit line GBL and comparing the read current with the reference current Iref.

The signal ENb is an inverted version of an enable signal EN. In at least one embodiment, the enable signal EN is a chip enable (CEB) signal, a write enable (WEB) signal, or the like. The signal SCLKb is an inverted version of the internal clock signal SCLK. When all of the enable signal EN, internal clock signal SCLK, and BL selection signal SBL <i> are at a high level or have logic "1," the output of the AND gate 642 is at a high level or has logic "1." As a result, the transistor P61 is turned OFF and the transistor N61 is turned ON to couple the bit line BL[i] to the global bit line GBL. The bit line BL[i] is selected or accessed for an access operation. When any one of the enable signal EN, internal clock signal SCLK, and BL selection signal SBL <i> is at a low level or has logic "0," the output of the AND gate 642 is at a low level or has logic "0." As a result, the transistor P61 is turned ON and the transistor N61 is turned OFF. The bit line BL[i] is disconnected from the global bit line GBL, and is not selected or accessed for an access operation.

Figure 6B:
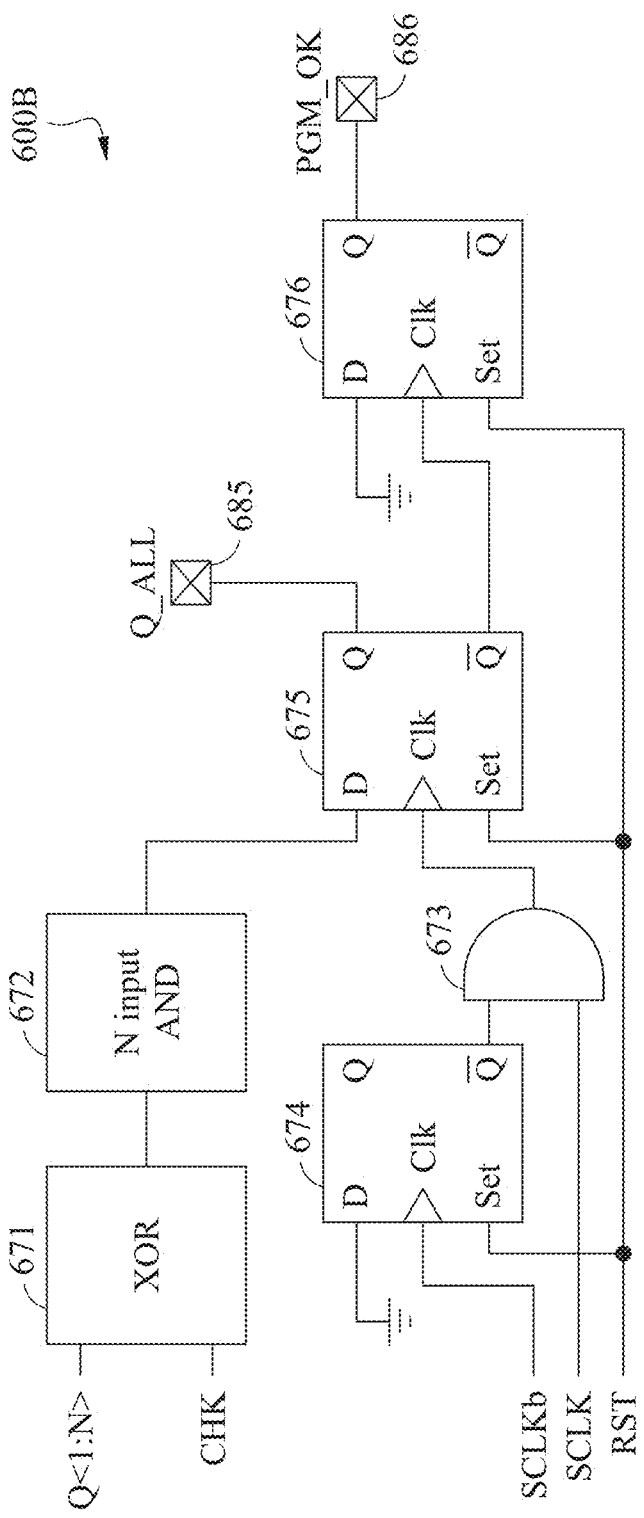

FIG. 6B is a schematic circuit diagram of an interface circuit 600B, in accordance with some embodiments. In some embodiments, the interface circuit 600B corresponds to at least one of the interface circuit 170 or the interface circuit 300. In at least one embodiment, in addition to the circuits discussed with respect to in FIG. 6B, the interface circuit 600B further comprises one or more circuits described with respect to FIGS. 3A, 4A-4J.

The interface circuit 600B comprises a XOR gate 671, an N-input AND gate 672, an AND gate 673, and D flip-flops 674, 675, 676. The XOR gate 671 comprises first and second inputs coupled to correspondingly receive the read data Q<1:N> and a signal CHK, and an output. The AND gate 672 comprises inputs coupled to the output of the XOR gate 671, and an output. The AND gate 673 comprises a first input, a second input coupled to receive the internal clock signal SCLK, and an output. The flip-flop 674 comprises a data input D which is grounded, a clock input coupled to receive the signal SCLKb, a set input coupled to receive a signal RST, and an inverted output (Q bar) coupled to the first input of the AND gate 673. The flip-flop 675 comprises a data input D coupled to the output of the AND gate 672, a clock input coupled to the output of the AND gate 673, a set input coupled to receive the signal RST, an output Q coupled to a node or I/O pin 685, and an inverted output (Q bar). The flip-flop 676 comprises a data input D which is grounded, a clock input coupled to the inverted output of the flip-flop 675, a set input coupled to receive the signal RST, and an output Q coupled to a node or I/O pin 686.

In a read operation in accordance with some embodiments, the signal CHK comprises check data to verify whether data previously programed into the memory circuit were correctly programmed or not. In at least one embodiment, the check data are input into the memory circuit through one or more I/O pins. In some embodiments, the check data are stored in or generated by the memory circuit.

At a beginning of the read operation, the signal RST is applied to the set inputs of the flip-flops 674, 675, 676, and causes the output Q of the flip-flops 674, 675, 676 to have a first logic state, e.g., logic "1." The read operation is performed based on the internal clock signal SCLK, access signal WLR and access signal WLP as described with respect to FIG. 5A. The AND gate 673 and the flip-flop 674 are configured to provide a clock signal similar to the internal clock signal SCLK to the clock input of the flip-flop 675.

While the read data Q<1:N> are being output in the read operation, the XOR gate 671 compares the check data in the signal CHK with the output read data Q<1:N>. For example, referring to FIG. 6A, in response to the first internal clock pulse SCLK, a bit of read data Q<1> is read from Segment 1 along the corresponding accessed bit line BL[1] (i.e., i=1). Similarly, a bit of read data Q<2> is read from Segment 2, . . . and a bit of read data Q<N> is read from Segment N. The N bits of read data Q<1:N> (e.g., an N-bit word) obtained in response to the first internal clock pulse SCLK are compared by the XOR gate 671 with the corresponding bits in the check data of the signal CHK, and the N comparison results (i.e., N bits) are input to and combined by the AND gate 672.

When the N-bit word of read data Q<1:N> is the same as the corresponding word in the check data, the AND gate 672 outputs logic "1" to the data input D of the flip-flop 675. The output Q of the flip-flop 675 remains at logic "1" which is output in a signal Q_ALL at the node 685 to indicate to external circuitry or equipment that there is no error in the current N-bit word. The inverted output (Q bar) of the flip-flop 675 remains at logic "0" which is applied to the clock input of the flip-flop 676. In response to logic "0" at the clock input, the flip-flop 676 retains the output Q at logic "1." The logic "1" at the output Q of the flip-flop 676 is output in a signal PGM_OK at the node 686 to indicate to the external circuitry or equipment that no error has been found so far.

When at least one bit in the N-bit word of read data Q<1:N> differs from a corresponding bit in the check data, the AND gate 672 outputs logic "0" to the data input D of the flip-flop 675. The output Q of the flip-flop 675 is switched to logic "0" which is output in the signal Q_ALL at the node 685 to indicate to the external circuitry or equipment that the current N-bit word has an error. The inverted output (Q bar) of the flip-flop 675 is switched to logic "1" which is applied to the clock input of the flip-flop 676. In response to logic "1" at the clock input, the flip-flop 676 switches the output Q to logic "0" corresponding to the data input D being grounded. The logic "0" at the output Q of the flip-flop 676 is output in the signal PGM_OK at the node 686 to indicate to the external circuitry or equipment that there is an error. The logic "0" of the signal PGM_OK will not be changed regardless of verification results at subsequent internal clock pulses SCLK.

In response to a subsequent internal clock pulse SCLK, the described process is repeated. Specifically, another N-bit word is read, one bit from each of Segments 1 to N, and is compared to a corresponding N-bit word in the check data. The comparison results will be output at the node 685, i.e., logic "1" at the node 685 indicates no error in the current N-bit word, whereas logic "0" indicates that the current N-bit word has an error.

At the end of the read operation, the signal PGM_OK at the node 686 indicates whether any error has been found, and the signal Q_ALL at the node 685 indicates the specific place(s), or the specific N-bit word(s), with an error. In some embodiments, when an error is found, the memory circuit will be re-programed, repaired, or rejected.

FIG. 7A is a flowchart of a method 700A, in accordance with some embodiments. In some embodiments, the method 700A is performed by, or at, one or more of the memory circuit 100, peripheral circuit 160, interface circuit 170, memory circuit 200, interface circuit 300, interface circuit 301, various circuits described with respect to one or more of FIGS. 4A-4K, memory circuit 600A and interface circuit 600B.

At operation 705, in response to a single pulse of a control signal, a series of internal clock pulses, a first access signal, and a second access signal are generated. For example, as described with respect to FIG. 5A, in response to a single control signal pulse 516 of a control signal SCLKEN, a series of internal clock pulses SCLK, a first access signal being one of the access signal WLR and access signal WLP, and a second access signal being the other of the access signal WLR and access signal WLP, are generated. In at least one embodiment, the internal clock pulse SCLK are generated at an internal clock period $T_{BL}$ corresponding to a pulse width PW of the control signal pulse 516. In at least one embodiment, the access signal WLR is generated responsive to a rising edge 518 of the control signal pulse 516, and/or the access signal WLP is generated responsive to a falling edge 519 of the control signal pulse 516.

At operation 715, at least one of a read operation or a program operation is performed in a memory circuit, based on the first access signal, the second access signal, and at least one internal clock pulse in the series of internal clock pulses. For example, as discussed with respect to FIGS. 2A, 2B, 5A, a program operation is performed in one or more embodiments. The access signal WLR is applied directly to a corresponding read word line WLR[1] ~ WLR[K] (in FIG. 2B), or to a WLR driver circuit coupled to the corresponding read word line, to apply a first access voltage to a gate of an access transistor (e.g., transistor T1 in FIG. 2A) of each memory cell MC coupled to the read word line to turn ON the access transistor. The access signal WLP is applied directly to a corresponding program word line WLP[1] ~ WLP[K] (in FIG. 2B), or to a WLP driver circuit coupled to the corresponding program word line, to apply a program voltage to a gate of an anti-fuse transistor (e.g., transistor T2 in FIG. 2A) of each memory cell MC. A plurality of bit lines BL[1] to BL[M] are sequentially selected or accessed in response to BL selection signals SBL <1:M> generated based on the internal clock pulses SCLK. When a selected bit line is grounded, the corresponding memory cell is programmed (e.g., stores logic "0") by the voltage stress caused by the program voltage across the gate dielectric of the anti-fuse transistor. When a sufficient voltage higher than the ground voltage, e.g., the first access voltage, is applied to a selected bit line, the corresponding memory cell is not programmed logic (e.g., stores logic "1"). A read operation is performed similarly, although with a different set of voltages applied to the word lines and bit line. In at least one embodiment, one or more advantages described herein are achievable by the method 700A.

Figure 7B:
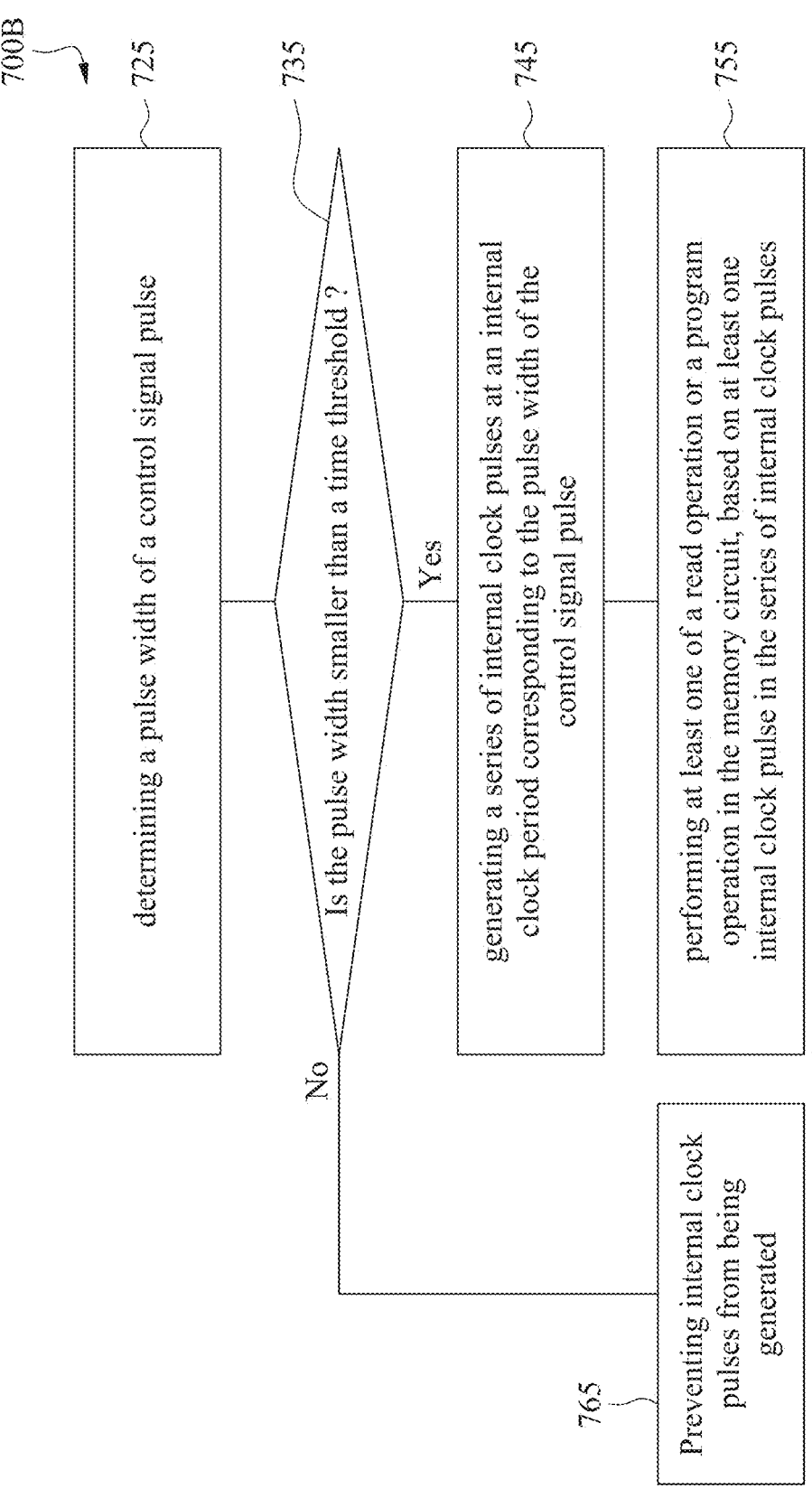

FIG. 7B is a flowchart of a method 700B, in accordance with some embodiments. In some embodiments, the method 700B is performed by, or at, one or more of the memory circuit 100, peripheral circuit 160, interface circuit 170, memory circuit 200, interface circuit 300, interface circuit 301, various circuits described with respect to one or more of FIGS. 4A-4K, memory circuit 600A and interface circuit 600B.

At operation 725, a pulse width of a control signal pulse is determined. For example, as described with respect to FIGS. 4B, 5A, in response to a rising edge 518 of a control signal pulse 516, a ripple counter 410 is enabled and start counting clock pulses CLK. The ripple counter 410 keeps counting clock pulses CLK until the counting operation of the ripple counter 410 is disabled by a falling edge 519 of the control signal pulse 516. The counted number of clock pulses CLK between the rising edge 518 and falling edge 519 of the control signal pulse 516 is determined as the pulse width of the control signal pulse 516.

At operation 735, it is determined whether the pulse width of the control signal pulse is smaller than a time threshold. For example, as described with respect to FIGS. 4B, 5A, a comparator circuit COMP1 compares the counted number of the ripple counter 410 (which is determined as the pulse width of the control signal pulse 516) with a time threshold T_Thres output by a multiplexer MUX1. In response to the counted number of the ripple counter 410 (i.e., the pulse width of the control signal pulse 516) being smaller than the time threshold T_Thres (i.e., Yes from operation 735), the process proceeds to operation 745. Otherwise (i.e., No from operation 735), the process proceeds to operation 765.

At operation 745, a series of internal clock pulses is generated at an internal clock period corresponding to the pulse width of the control signal pulse, for example, as described with respect to FIG. 5A and operation 705 in FIG. 7A.

At operation 755, at least one of a read operation or a program operation is performed in the memory circuit, based on at least one internal clock pulse in the series of internal clock pulses, for example, as described with respect to FIG. 5A and operation 715 in FIG. 7A.

At operation 765, generation of internal clock pulses SCLK is prevented. For example, as described with respect to FIGS. 4B, 5B, when the comparator circuit COMP1 determines that the pulse width of the control signal pulse 316 is not shorter than the time threshold T_Thres, the comparator circuit COMP1 switches the switch SW1 to the open state to disconnect an output 415 and the counted number of the ripple counter 410 from being stored by a storage circuit 320 to invoke over-time protection which, in turn, prevents internal clock pulses SCLK from being generated, as described with respect to FIG. 5B. In at least one embodiment, power consumption and/or potential malfunction are reduced by preventing a control signal pulse, that is longer than a time threshold, from being used for controlling an access operation. In at least one embodiment, one or more further advantages described herein are achievable by the method 700B.

The various low levels, high levels, logic "0," logic "1" described herein are example. It is within the scopes of various embodiments to modify one or more of the described circuits or signals to include a low level instead of a described high level and vice versa, and/or to include logic "0" instead of described logic "1" and vice versa.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a memory circuit comprises a memory array, and a peripheral circuit. The peripheral circuit comprises an internal clock generating circuit, and a first access signal generating circuit. The internal clock generating circuit is configured to, in response to a control signal pulse, generate a series of internal clock pulses at an internal clock period corresponding to a pulse width of the control signal pulse. The first access signal generating circuit is configured to, in response to a first edge of the control signal pulse, generate a first access signal. The peripheral circuit is configured to control an access operation in the memory array, based on at least one internal clock pulse in the series of internal clock pulses, and the first access signal.

In some embodiments, an interface circuit for a memory circuit comprises a first counter circuit, a first latch circuit, a second counter circuit, a first comparator circuit, and a second latch circuit. The first counter circuit comprises an input coupled to a control signal input, a clock input coupled to a clock signal input, and an output. The first latch circuit comprises an input coupled to the output of the first counter circuit, a clock input coupled to the clock signal input, and an output. The second counter circuit comprises a clock input coupled to the clock signal input, and an output. The first comparator circuit comprises a first input coupled to the output of the first latch circuit, a second input coupled to the output of the second counter circuit, and an output. The second latch circuit comprises a clock input coupled to the output of the first comparator circuit, and an output.

In some embodiments, a method of operating a memory circuit comprises, in response to a single pulse of a control signal, generating a series of internal clock pulses, a first access signal, and a second access signal. The method further comprises performing at least one of a read operation or a program operation in the memory circuit, based on the first access signal, the second access signal, and at least one internal clock pulse in the series of internal clock pulses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a memory array; and
a peripheral circuit comprising:
an internal clock generating circuit configured to, in response to a control signal pulse, generate a series of internal clock pulses at an internal clock period corresponding to a pulse width of the control signal pulse, and
a first access signal generating circuit configured to, in response to a first edge of the control signal pulse, generate a first access signal,
wherein the peripheral circuit is configured to control an access operation in the memory array, based on
at least one internal clock pulse in the series of internal clock pulses, and
the first access signal,
the internal clock generating circuit comprises a pulse width detecting circuit configured to detect the pulse width of the control signal pulse, and
the internal clock generating circuit is configured to generate the series of internal clock pulses at the internal clock period corresponding to the detected pulse width of the control signal pulse.

2. The memory circuit of claim 1, wherein
the memory array comprises:
a plurality of memory cells arranged in a plurality of rows and a plurality of columns,
a plurality of first word lines each coupled to the memory cells in one corresponding row among the plurality of rows of the memory array, and
a plurality of bit lines each coupled to the memory cells in one corresponding column among the plurality of columns of the memory array, and
the peripheral circuit is configured to
in response to the first access signal, access a first word line among the plurality of first word lines, and
in response to each internal clock pulse in the series of internal clock pulses, access one corresponding column among the plurality of columns.

3. The memory circuit of claim 2, wherein
the memory array further comprises:
a plurality of second word lines each coupled to the memory cells in one corresponding row among the plurality of rows of the memory array,
the peripheral circuit further comprises:
a second access signal generating circuit configured to, in response to a second edge of the control signal pulse, generate a second access signal, and
the peripheral circuit is configured to
in response to the second access signal, access a second word line among the plurality of second word lines, wherein the accessed first word line and the accessed second word line are coupled to the memory cells in the same row among the plurality of rows of the memory array.

4. The memory circuit of claim 3, wherein
the first edge is a rising edge of the control signal pulse,
the second edge is a falling edge of the control signal pulse, and
a duration of the second access signal is within a duration of the first access signal.

5. The memory circuit of claim 1, wherein the internal clock generating circuit further comprises:
a storage circuit coupled to an output of the pulse width detecting circuit, and configured to store the detected pulse width of the control signal pulse.

6. The memory circuit of claim 1, wherein
the internal clock generating circuit is configured to, in response to the detected pulse width of the control signal pulse being greater than an adjustable time threshold, disconnect a storage circuit from an output of the pulse width detecting circuit.

7. The memory circuit of claim 5, wherein
the pulse width detecting circuit comprises a first counter circuit configured to count a first number of clock pulses of a clock signal during the pulse width of the control signal pulse, and
the storage circuit is configured to store the first number output by the first counter circuit as the stored detected pulse width of the control signal pulse.

8. The memory circuit of claim 7, wherein the internal clock generating circuit further comprises:
a second counter circuit configured to count, after the control signal pulse has ended, a second number of clock pulses of the clock signal, and
a comparator circuit configured to, in response to the second number output by the second counter circuit being equal to the first number stored in the storage circuit, output an intermediate signal to
cause an internal clock pulse to be output in the series of internal clock pulses, and
reset the second counter circuit.

9. The memory circuit of claim 8, wherein the internal clock generating circuit further comprises:
a cell count circuit configured to
count a third number of internal clock pulses being output in the series of internal clock pulses, and
in response to the third number equal to an adjustable threshold corresponding to a number of memory cells, of the memory array, being accessible in the access operation, output a further intermediate signal to stop outputting the series of internal clock pulses.

10. An interface circuit for a memory circuit, the interface circuit comprising:
a first counter circuit comprising:
an input coupled to a control signal input,
a clock input coupled to a clock signal input, and
an output;
a first latch circuit comprising:
an input coupled to the output of the first counter circuit,
a clock input coupled to the clock signal input, and
an output;
a second counter circuit comprising:
a clock input coupled to the clock signal input, and
an output;
a first comparator circuit comprising:
a first input coupled to the output of the first latch circuit,
a second input coupled to the output of the second counter circuit, and
an output; and a second latch circuit comprising:

a clock input coupled to the output of the first comparator circuit, and an output.

11. The interface circuit of claim 10, wherein the output of the first comparator circuit is coupled to a reset input of the second counter circuit.

12. The interface circuit of claim 10, further comprising:

a third counter circuit comprising:

an input coupled to the output of the first comparator circuit, a clock input coupled to the clock signal input, and an output coupled to an enable input of the second latch circuit.

13. The interface circuit of claim 12, further comprising:

a multiplexer comprising:

a plurality of inputs, and an output;

a second comparator circuit comprising:

a first input coupled to the output of the third counter circuit, a second input coupled to the output of the multiplexer, and an output; and a switch coupled between the output of the third counter circuit and the enable input of the second latch circuit, the switch comprising a control terminal coupled to the output of the second comparator circuit.

14. The interface circuit of claim 13, wherein the switch comprises a normally-open switch.

15. The interface circuit of claim 12, wherein at least one of the first counter circuit, the second counter circuit or the third counter circuit comprises a ripple counter.

16. The interface circuit of claim 10, further comprising:

a multiplexer comprising:

a plurality of inputs, and an output;

a second comparator circuit comprising:

a first input coupled to the output of the first counter circuit, a second input coupled to the output of the multiplexer, and an output; and a switch coupled between the output of the first counter circuit and the input of the first latch circuit, the switch comprising a control terminal coupled to the output of the second comparator circuit.

17. The interface circuit of claim 16, wherein the switch comprises a normally-closed switch.

18. The interface circuit of claim 10, further comprising:

an edge detector circuit comprising:

an input coupled to the control signal input, a clock input coupled to the clock signal input, and an output coupled to an input of the second counter circuit.

19. The interface circuit of claim 10, further comprising:

a rising edge detector circuit comprising:

an input coupled to the control signal input, a clock input coupled to the clock signal input, and a reset input configured to receive a first reset signal; and a falling edge detector circuit comprising:

an input coupled to the control signal input, a clock input coupled to the clock signal input, and a reset input configured to receive a second reset signal before the first reset signal is received at the reset input of the rising edge detector circuit.

20. A method of operating a memory circuit, the method comprising:

in response to a single pulse of a control signal, generating a series of internal clock pulses, a first access signal different from the series of internal clock pulses, and a second access signal different from the first access signal and the series of internal clock pulses; and performing at least one of a read operation or a program operation in the memory circuit, based on the first access signal, the second access signal, and at least one internal clock pulse in the series of internal clock pulses.

* * * * *